(12) United States Patent
Taniguchi et al.

(10) Patent No.: US 6,242,954 B1
(45) Date of Patent: Jun. 5, 2001

(54) TIMING CLOCK GENERATION CIRCUIT USING HIERARCHICAL DLL CIRCUIT

(75) Inventors: Nobutaka Taniguchi; Hiroyoshi Tomita, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/385,010

(22) Filed: Aug. 27, 1999

(30) Foreign Application Priority Data

Oct. 15, 1998 (JP) .................................................. 10-294062

(51) Int. Cl.[7] ........................................................ H04L 7/08
(52) U.S. Cl. ............................ 327/149; 327/158; 327/277
(58) Field of Search ..................................... 327/147, 149, 327/156, 158, 237, 236, 277; 331/1 R, 1 A, 18, DIG. 2; 375/119, 120

(56) References Cited

U.S. PATENT DOCUMENTS

| 5,552,726 | 9/1996 | Wichman et al. | ................. 327/149 |
| 5,969,551 | * 10/1999 | Fujioka | ................. 327/158 |

FOREIGN PATENT DOCUMENTS

| 10-112182 | 4/1998 | (JP) . |
| 10-276074 | 10/1998 | (JP) . |
| 10-336008 | 12/1998 | (JP) . |
| 11-55091 | 2/1999 | (JP) . |

OTHER PUBLICATIONS

Han et al, "Skew Minimization Techniques for 256M–bit Synchronous DRAM and Beyond", 1996 Symposium on VLSI Circuits Digest of Technical Papers, pp. 192–193.

* cited by examiner

Primary Examiner—Dinh T. Le
(74) Attorney, Agent, or Firm—Arent Fox Kintner Plotkin & Kahn, PLLC

(57) ABSTRACT

The present invention has a hierarchical DLL circuit comprising a rough DLL circuit for phase adjustment by rough delay unit and a fine DLL circuit for phase adjustment by smaller, fine delay unit. When phase adjustment begins, only the rough DLL circuit operates; when the rough DLL circuit locks on, phase adjustment by the rough DLL circuit ends and the delay amount of the rough DLL circuit is set. When the rough DLL circuit locks on, the fine DLL circuit is caused to operate. In this way, the phase of the timing clock generated by the DLL circuit is adjusted only by fine delay units even if the phase of the reference clock is temporarily shifted by a large amount due to power source noise or the like. Consequently, in the event of temporary phase shifting, the amount of jitter in the timing clock can be suppressed to the small amount of a fine delay unit. Phase adjustment by the rough DLL circuit is stopped by ending phase comparison by the phase comparison circuit, or ending the input of the clock to the phase comparison circuit, for example.

18 Claims, 23 Drawing Sheets

TIMING CLOCK GENERATION CIRCUIT USING HIERARCHICAL DLL CIRCUIT

BACKGROUND OF THE INVENTION

1. Field of the Invention

The present invention relates to a timing clock generation circuit installed in a synchronous integrated circuit device, or the like, and which adjusts the phase of the reference clock and generates a prescribed timing clock. Furthermore, the present invention relates to a timing clock generation circuit using a hierarchical DLL which comprises a rough DLL circuit having a rough variable delay circuit controlled in rough delay units and a fine DLL circuit having a fine variable delay circuit controlled in fine delay units. In the case where the phase of the reference clock is temporarily changed by noise or the like, and in the case where the reference clock fluctuates, the timing clock generation circuit relating to the present invention can prevent unnecessary changes to the phase of the timing clock generated.

2. Description of the Related Art

A synchronous integrated circuit device such as synchronous dynamic RAM (SDRAM) synchronizes with a reference clock supplied from outside or operates an internal circuit in a prescribed phase relationship with a reference clock. Such a device therefore includes a timing clock generation circuit for internally regulating the phase of the reference clock and generating a timing clock.

Such a timing clock generation circuit uses a DLL circuit to eliminate the effects of the propagation delay of the reference clock within the integrated circuit device. Specifically, the DLL circuit comprises a variable delay circuit that delays the reference clock and outputs a timing clock, and a phase comparing/delay controlling circuit that compares the phase of the reference clock with the variable clock delayed thereby and adjusts the delay of the variable delay circuit so that those phases match. The basic constitution of such a DLL circuit is disclosed in Japanese Patent Laid-open No. 10-112182 (published Apr. 28, 1998).

The variable delay circuit within the abovementioned DLL circuit comprises multiple connected delay unit circuits having prescribed delay units. Consequently, when the number of the delay unit is changed, the phase of the timing clock generated by the variable delay circuit is changed by an amount equal to one delay unit. Such a change by one delay unit is called a quantization error; according to such an error, the timing clock has jitter (fluctuates) corresponding to the quantization error. It therefore becomes difficult to correctly match the phase of the timing clock with the reference clock.

In Japanese Patent Application No.09-203315 (application date: Jul. 29, 1997) and U.S. patent application Ser. No. 09/089,397 (application date: Jun. 3, 1998), for example, the applicant has proposed a hierarchical DLL circuit using a rough DLL circuit and fine DLL circuit, in order to minimize this jitter and to precisely match the phase of the timing clock with the reference clock.

Such a hierarchical DLL circuit can match the phase of the timing clock with the reference clock with good precision by regulating the phase of the timing clock in rough delay units with the rough DLL circuit, while regulating the phase of the timing clock in smaller delay units with the fine DLL circuit.

Even when such a hierarchical DLL circuit is used, however, the delay of the variable delay circuit is adjusted in rough delay units when the phase of the externally supplied reference clock undergoes a large, temporary shift due to a cause such as power source noise or the like. As a result, jitter from the large rough delay units is generated in the timing clock during the interval until the next phase comparison. When such major jitter is generated, normal control of the internal circuit according to the timing clock cannot be carried out.

Furthermore, when the reference clock supplied from outside has uniform jitter (fluctuation), phase adjustment in fine delay units repeated for ever; sometimes the fine DLL circuit does not lock on. In that case, the timing clock also continues to have unlimited jitter and normal control of the internal circuit according to the timing clock cannot be carried out.

It is an object of the present invention to provide a timing clock generation circuit using a hierarchical DLL circuit that can minimize jitter of the timing clock, even when the phase of the reference clock is temporarily shifted because of noise or the like.

Furthermore, it is another object of the present invention to provide a timing clock generation circuit using a hierarchical DLL circuit that can fix the phase of the timing clock generated even when the reference clock includes uniform jitter.

Furthermore, it is another object of the present invention to provide a timing clock generation circuit using a hierarchical DLL circuit that can minimize jitter of the timing clock even when the phase of the reference clock is shifted temporarily due to noise or the like, and furthermore, can match the phase of the timing clock, beyond the delay control range of the fine variable delay circuit, even when the phase of the reference clock varies.

SUMMARY OF THE INVENTION

In order to achieve the abovementioned objects, the present invention has a hierarchical DLL circuit comprising a rough DLL circuit for phase adjustment by rough delay unit and a fine DLL circuit for phase adjustment by smaller, fine delay unit. When phase adjustment begins, only the rough DLL circuit operates; when the rough DLL circuit locks on, phase adjustment by the rough DLL circuit ends and the delay amount of the rough DLL circuit is set. When the rough DLL circuit locks on, the fine DLL circuit is caused to operate. In this way, the phase of the timing clock generated by the DLL circuit is adjusted only by fine delay units even if the phase of the reference clock is temporarily shifted by a large amount due to power source noise or the like. Consequently, in the event of temporary phase shifting, the amount of jitter in the timing clock can be suppressed to the small amount of a fine delay unit. Phase adjustment by the rough DLL circuit is stopped by ending phase comparison by the phase comparison circuit, or ending the input of the clock to the phase comparison circuit, for example.

In the present invention, furthermore, if the fine DLL circuit also locks on, the clock frequency for the DLL circuit is reduced, and the operation changes to phase adjustment over a long cycle; subsequent phase adjustment is then effected only by the fine DLL circuit. As a result, power consumption by the DLL circuit can be kept low. Or, in the present invention, once the fine DLL circuit carries out phase adjustment a given number of times, the frequency of the clock for the DLL circuit is forced to become low, changing phase adjustment operations over a long cycle; after that, phase adjustment is effected only by the fine DLL circuit. Because of this, even if the reference clock itself includes jitter; it can be prevented that the fine DLL circuit cannot lock on so that phase adjustment of the generated timing clock is repeated within a short period.

It is another feature of the present invention that phase adjustment by the fine DLL circuit circuit stops if the fine DLL circuit locks on as well. As a result, the phase of the generated timing clock is prevented from changing even when the phase of the reference clock is shifted temporarily due to noise thereafter. Or, in the present invention, the phase adjustment operations by the fine DLL circuit also stop once the fine DLL circuit performs phase adjustment for a prescribed number of times. Even if the reference clock itself includes jitter, the phase of the generated timing clock can be prevented from fluctuating without the fine DLL circuit locking on.

The present invention uses a hierarchical DLL circuit; when phase adjustment begins, only the rough DLL circuit performs phase adjustment and if the rough DLL circuit locks on, phase adjustment thereby ends and phase adjustment is then carried out by the fine DLL circuit. In the event of a delay amount greater than the maximum number of fine variable delay circuits during phase adjustment by the fine DLL circuit, the rough delay units of the rough DLL circuit are increased by one. In the event of a delay amount less than the minimum number of fine variable delay circuits during phase adjustment by the fine DLL circuit, the rough delay units of the rough DLL circuit are decreased by one. As a result, even when the phase of the reference clock supplied varies greatly in excess of the range of fine phase adjustment while phase adjustment by the rough DLL circuit is stopped; since the delay amount of the rough variable delay circuit can be finely adjusted, a timing clock matching those changes can therefore be generated. In that case as well, jitter in the generated timing clock can be reduced because phase adjustment is mainly carried out by the fine DLL circuit.

In order to achieve the abovementioned objects, the present invention is a timing clock generation circuit for regulating the phase of a reference clock and generating a timing clock comprising: a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together; a rough phase comparing/delay controlling circuit for comparing the phase of the reference clock with a phase of a variable clock generated by delaying for a prescribed period a feedback clock having the same timing as said timing clock, and controlling said rough variable delay circuit so that those phases match; a fine phase comparing/delay controlling circuit for comparing the phases of said variable clock and said reference clock and controlling said fine variable delay circuit so that those phases match; and a DLL controlling circuit for activating said rough phase comparing/delay controlling circuit at the initiation of phase adjustment, maintaining the delay time of said rough variable delay circuit after said rough phase comparing/delay controlling circuit detects lock on, and activating said fine phase comparing/delay controlling circuit, so as to cause said fine variable delay circuit to carry out delay control.

Furthermore, in order to achieve the abovementioned objects, the present invention is a timing clock generation circuit for regulating the phase of a reference clock and generating a timing clock comprising: a first variable delay circuit which delays said reference clock for a given delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together; a rough phase comparing/delay controlling circuit for comparing the phase of the reference clock with a the phase of a variable clock generated by delaying for a prescribed period a feedback clock having the same timing as said timing clock, and controlling said rough variable delay circuit so that those phases match; a fine phase comparing/delay controlling circuit for comparing the phases of said variable clock and said reference clock and controlling said fine variable delay circuit so that those phases match; and a DLL controlling circuit for activating said rough phase comparing/delay controlling circuit at the initiation of phase adjustment, maintaining the delay time of said rough variable delay circuit while activating said fine phase comparing/delay controlling circuit after said rough phase comparing/delay controlling circuit detects lock on, and maintaining the delay time of the fine variable delay circuit so as to end phase adjustment when said fine phase comparing/delay controlling circuit detects lock on.

Furthermore, in order to achieve the abovementioned objects, the present invention is a timing clock generation circuit for regulating the phase of a reference clock and generating a timing clock comprising: a first variable delay circuit which delays said reference clock for a delay time and outputs said timing clock, and which comprises a rough variable delay circuit including rough delay units and a fine variable delay circuit including fine delay units each having an unit delay time which is shorter than said rough delay units, wherein the rough and fine variable delay circuits are serially connected together; a rough phase comparing/delay controlling circuit for comparing the phase of the reference clock with a phase of a variable clock generated by delaying for a prescribed period a feedback clock having the same timing as said timing clock, and controlling said rough variable delay circuit so that those phases match; and a fine phase comparing/delay controlling circuit for comparing the phases of said variable clock and said reference clock and controlling said fine variable delay circuit so that those phases match; wherein said rough phase comparing/delay controlling circuit is activated and the delay amount of said rough variable delay circuit is controlled when phase adjustment begins; wherein after said rough phase comparing/delay controlling circuit detects lock on, phase comparison by said rough phase comparing/delay controlling circuit ends and said fine phase comparing/delay controlling circuit is activated so that the delay amount of said fine variable delay circuit is controlled; and in the case where said fine variable delay circuit exceeds the maximum delay amount, the delay amount of said rough variable delay circuit is increased by said rough delay unit; and in the case where said fine variable delay circuit is less than the minimum delay amount, the delay amount of said rough variable delay circuit is decreased by said rough delay unit.

DESCRIPTION OF THE PREFERRED EMBODIMENTS

The preferred embodiments of the present invention are explained below with reference to the figures. However, such embodiments do not limit the technical scope of the present invention.

Figure 1:
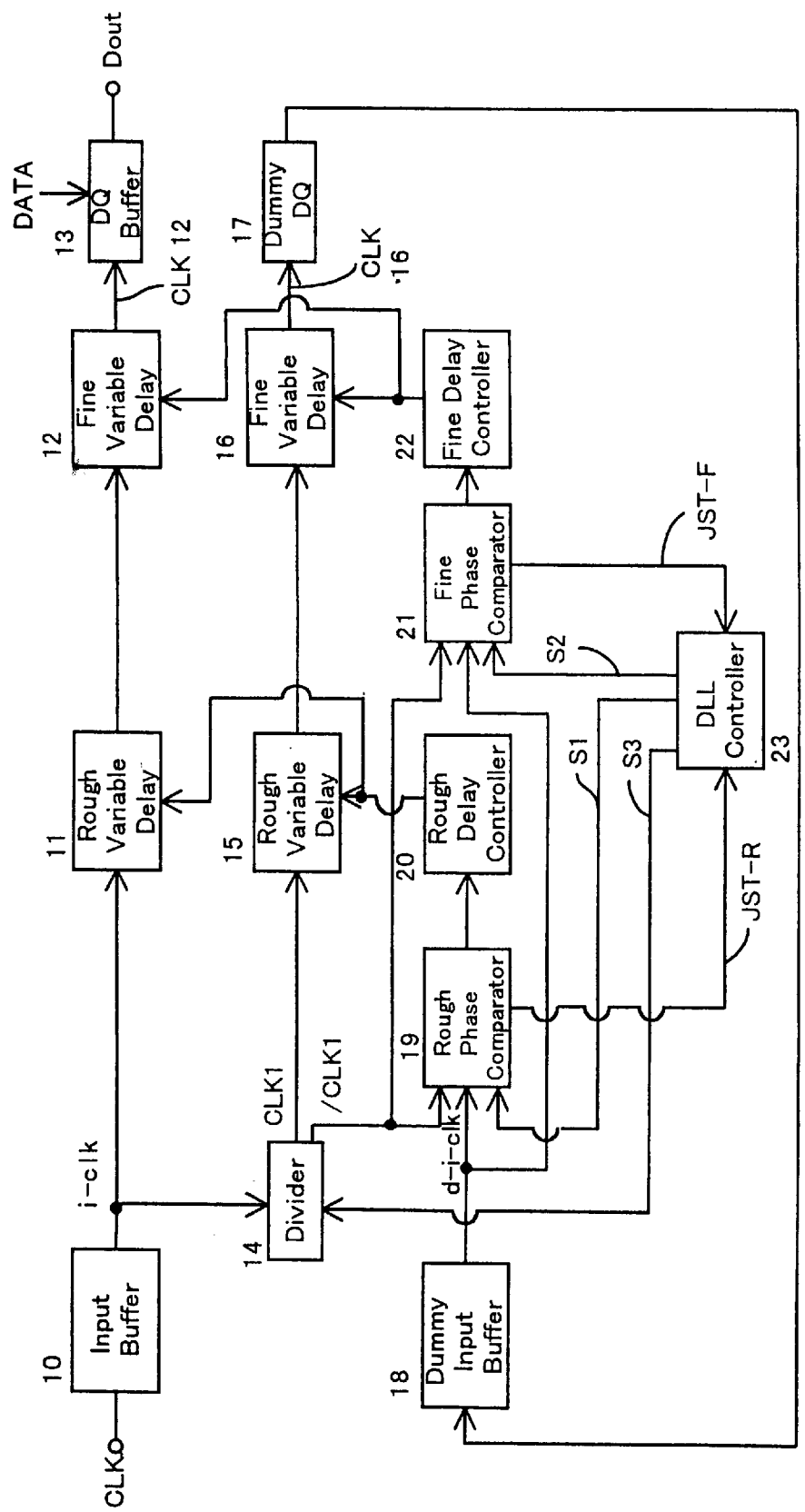
FIG. 1 shows the constitution of the timing clock generation circuit using a hierarchical DLL circuit.

FIG. 1 shows the constitution of the timing clock generation circuit using a hierarchical DLL circuit, disclosed in Japanese Patent Application No.09-203315 (application date Jul. 29, 1997) applied for by the present applicant. In the present embodiment, the DLL circuit for rough adjustment and the DLL circuit for fine adjustment form a hierarchical structure in order to realize highly precise phase adjustment. An external clock signal CLK is taken up by an input buffer 10 and input as the internal clock i-clk; this is then supplied to the rough variable delay circuit 11 and fine variable delay circuit 12 and output as the timing clock CLK12. Furthermore, the internal clock i-clk is input to the divider 14, where the frequency thereof is divided and low frequency clock signals CLK1, /CLK1 are generated. These divided clock signals CLK1, /CLK1 are each supplied to the rough phase comparator 19 and fine phase comparator 21 respectively as first inputs (reference clock c-clk); and meanwhile, the divided clock signals are supplied to the rough variable delay circuit 15 and fine variable delay circuit 16 which are serially connected. The feedback clock CLK 16 which is output from the fine variable delay circuit 16 has the same timing as the timing clock CLK12; the feedback clock is supplied by means of the dummy data buffer 17 and dummy input buffer 18 to the rough phase comparator 19 and fine phase comparator 21 as a second input (variable clock d-i-clk).

The rough phase comparator 19 and fine phase comparator 21 compare the phases of abovementioned two input clocks and output the results of the comparison to the rough delay controlling circuit 20 and fine delay controlling circuit 22 respectively. The rough delay controlling circuit 20 and fine delay controlling circuit 22 control the delay amounts of the rough variable delay circuits 11, 15 and fine variable delay circuits 12, 16 on the basis of the phase comparison results. The internal clock i-clk is delayed by the rough variable delay circuit 11 and fine variable delay circuit 12 which are serially connected as noted above; the timing clock CLK12 is generated and supplied to the data output buffer 13. The data output buffer 13 synchronizes with the timing clock CLK12 supplied and takes up internal data DATA, then outputs the data externally.

A DLL controlling circuit 23 is established in this timing clock generation circuit in order to carry out highly precise phase adjustment. The DLL controlling circuit 23 controls the operations of the divider 14, rough phase comparator 19, and fine phase comparator 21, on the basis of phase comparison results in the rough phase comparator 19 and fine phase comparator 21.

Figure 2:
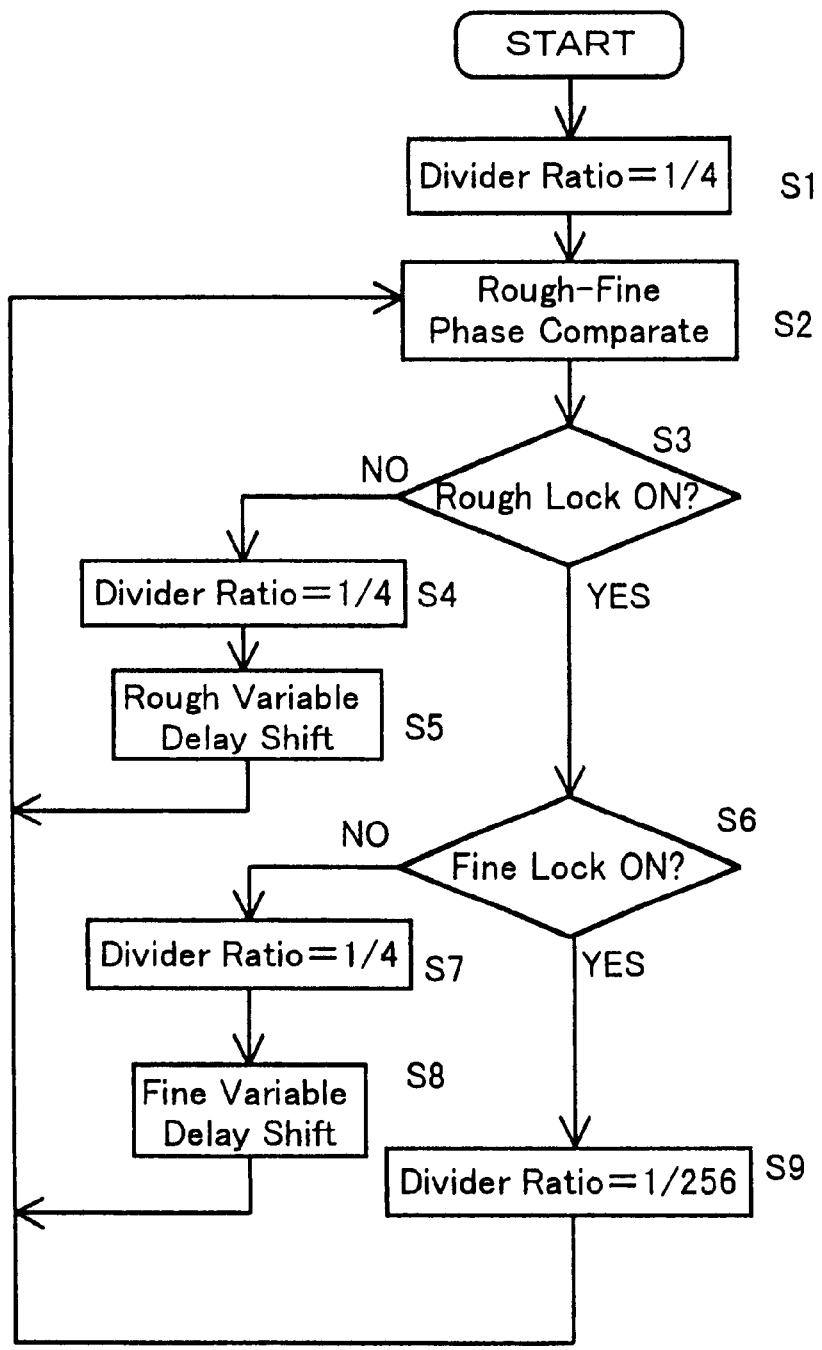
FIG. 2 is a flow chart showing the phase adjustment procedures of the timing clock generation circuit in FIG. 1.

FIG. 2 is a flow chart showing the phase adjustment procedures of the timing clock generation circuit in FIG. 1. The phase adjustment procedures are explained based on this flow chart. When power is turned on or when recovering from a powered down state, the divider 14 is set to a short cycle (1/4 division) (S1) and the phase comparison operation is carried out with the rough phase comparator 19 and the fine phase comparator 21 (S2). When the lock on signal JST-R is not output from the rough phase comparator 19, only the delay amounts of the rough variable delay circuits 11, 15 are adjusted with the rough delay controlling circuit 20 (S5) with the first and second input clocks in a short cycle state (S4). When the lock on signal JST-R is output from the rough phase comparator 19 (S3), phase adjustment is carried out according to the comparison results from the fine phase comparator 21 (S8). When the lock on signal JST-F is not output from the fine phase comparator 21, only the delay amounts of the fine variable delay circuits 12, 16 are adjusted (S8) while the first and second input clocks remain in the short cycle state (S7). When the lock on signal JST-F is output from the fine phase comparator 21 (S6), the divider 14 is set to a long cycle (1/256 division) (S9). After that, phase comparison is carried out over a long cycle. The divider is reset to the short cycle (S4, S7) and the delay amounts of the corresponding variable delay circuits 11, 12, 15, 16 are adjusted only when the rough phase comparator 19 or fine phase comparator 21 shifts from the locked on state to lock off state.

In the abovementioned timing clock generation circuit, after the fine phase comparator 21 is locked on, the clock signals /CLK1 and d-i-clk are sampled over a long cycle so that phase comparison is carried out with the rough phase comparator 19 and fine phase comparator 21. When the phase of the internal clock signal i-clk, as the standard, varies due to power source noise or the like at this time, an error occurs in the phase comparison results and the phase comparators 19, 21 sometimes shift from the locked on state. That error is detected by the delay controlling circuits 20, 21, is used to change the delay amounts of the variable delay circuits 11, 15, 12, 16, and becomes a cause of jitter in the generated timing clock CLK12.

In particular, when the rough phase comparator 19 has errors in the phase comparison results and shifts from the locked on state, jitter (fluctuation) greater than the large unit delay amount of the rough variable delay circuit 11 occurs in the timing clock CLK12. When the jitter occurring in the timing clock signal CLK12 is great, correct phase adjustment of the data output buffer in the circuit becomes impossible.

First Embodiment

Figure 3:
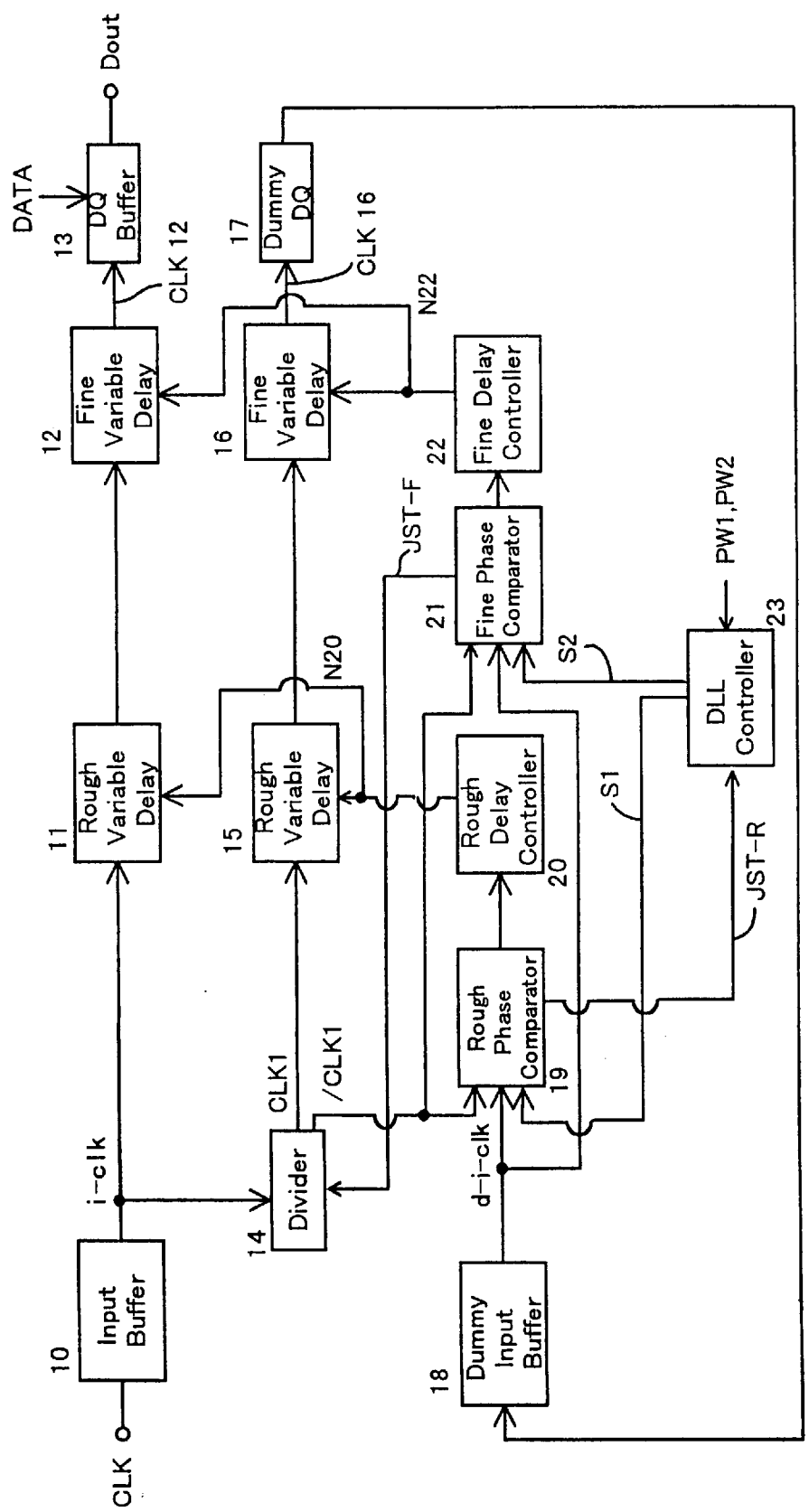
FIG. 3 shows the constitution of a timing clock generation circuit relating to a first embodiment.

FIG. 3 shows the constitution of the timing clock generation circuit relating to a first embodiment of the present invention. The same call-outs as in FIG. 1 are used for corresponding portions of FIG. 3. The timing clock generation circuit in the first embodiment comprises a DLL circuit for rough phase adjustment and a DLL circuit circuit for fine phase adjustment, as in FIG. 1.

Figure 4:
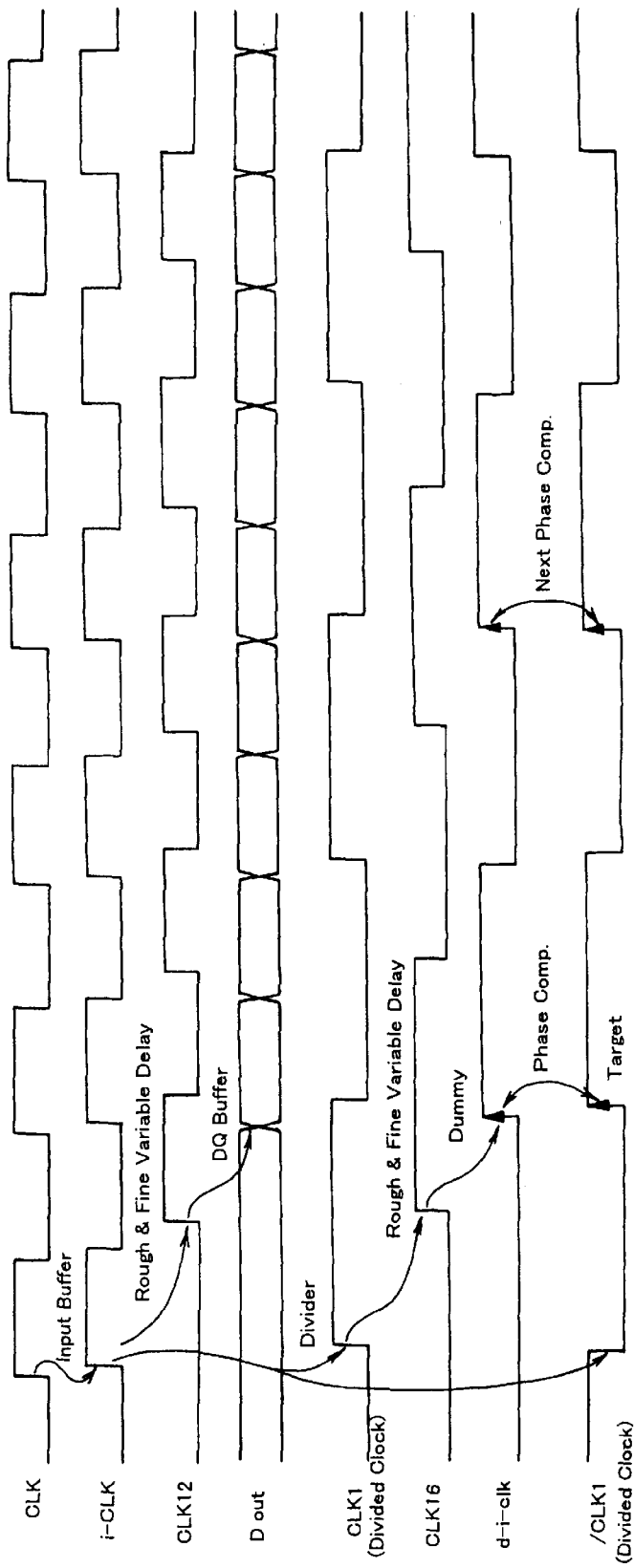
FIG. 4 is a timing chart of the timing clock generation circuit in FIG. 3.

FIG. 4 is a timing chart for the timing clock generation circuit in FIG. 3. The operation of the timing clock generation circuit in FIG. 3 is explained with reference to FIG. 4. The external clock CLK is taken up by the input buffer 10 and becomes the internal clock i-clk. The internal clock i-clk is the reference clock; it passes through the rough variable delay circuit 11 and fine variable delay circuit 12 and is supplied to the data output buffer 13 as the timing clock CLK12.

The internal clock i-clk, which is the reference clock, is divided into prescribed frequencies by the divider 14 and becomes the clock CLK1 and the inverse clock /CLK1. These clocks CLK1, /CLK1 have a slightly different phase, as delayed by the divider, from the internal clock i-clk and become the reference clock in the DLL circuit. The inverse clock /CLK1 is input as the reference clock to the rough phase comparator 19 and the fine phase comparator 21. The clock CLK1 is delayed by the rough variable delay circuit 15 and fine variable delay circuit 16 for a feedback loop within the DLL circuit and a feedback clock CLK16 having the same phase as the timing clock CLK12 is generated. This clock CLK16 is given the same delay amount as the data output buffer 13 and data input buffer 10 with the dummy data output buffer 17 and dummy input buffer 18, as in FIG. 1. This clock CLK16 is supplied as the variable clock d-i-clk to the rough phase comparator 19 and fine phase comparator 21. Depending on the phase comparison results of each comparator, the rough delay controlling circuit 20 provides the delay control signal N20 to the variable delay circuits 11, 15. Also, the fine delay controlling circuit 22 provides the delay control signal N22 to the variable delay circuits 12, 16.

Each of the phase comparators 19, 21 performs a phase comparison of the leading edge of the divided reference clock /CLK and the leading edge of the delayed variable clock d-i-clk. The delay controlling circuits 20, 22 control the delay amount for the variable delay circuits 11, 15, 12, 16 according to the phase comparison results so that those phases match. The control of the delay amounts is discussed in greater detail below, but basically, the delay amounts are controlled by increasing or decreasing the delay units of each by one.

In the first embodiment, the DLL controlling circuit 23 generates the rough activation signal S1 and activates the rough phase comparator 19 when phase adjustment begins. As a result, the rough phase comparator 19 compares the phases of both input clocks /CLK1, d-i-clk; the rough delay controlling circuit 20 adjusts the delay amounts for the rough variable delay circuits 11, 15. When the rough phase comparator 19 detects lock on, it supplies the lock on signal JST-R to the DLL controlling circuit 23. In response to that, the DLL controlling circuit 23 chaneges the rough activation signal S1 in an inactive state and stops the operation of the rough phase comparator 19. At the same time, the DLL controlling circuit 23 generates the fine activation signal S2 and activates the fine phase comparator 21. The delay amounts of the fine variable delay circuits 12, 16 are thereby adjusted. While the delay amounts of the fine variable delay circuits 12, 16 are adjusted, the delay amounts of the rough variable delay circuits 11, 15 are maintained in the state they were in at lock on and do not change.

Then, when the fine phase comparator 21 detects lock on, the lock on signal JST-F is supplied to the divider 14. The divider 14 divides the internal clock i-clk by a lower frequency. As a result, phase comparison by the fine phase comparator 21 and consequent adjustment of the delay amounts of the fine variable delay circuits 12, 16 are carried out over a longer cycle.

Figure 5:
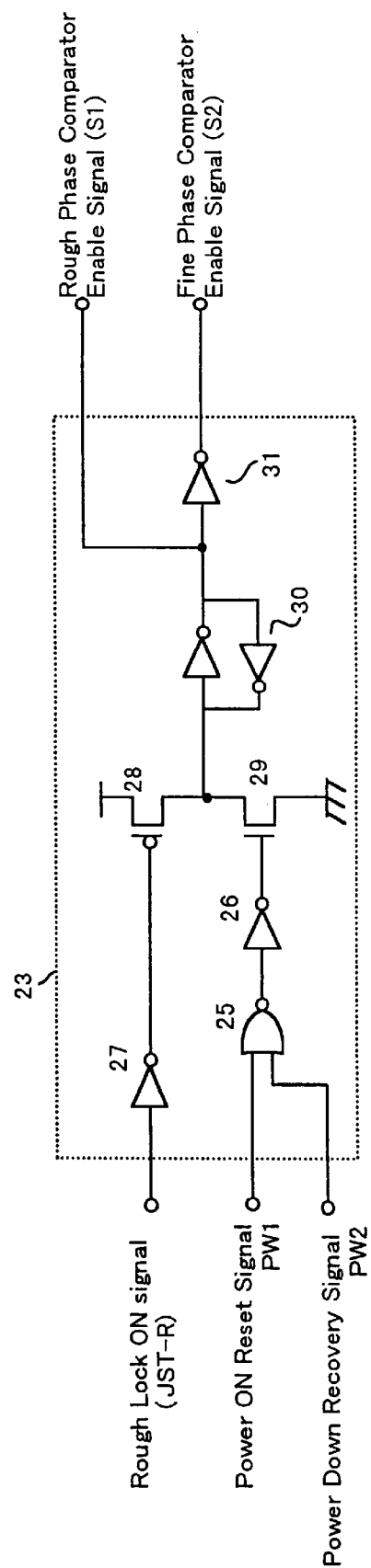
FIG. 5 shows the DLL controlling circuit.

FIG. 5 is a drawing showing the DLL controlling circuit. The DLL controlling circuit 23 comprises a NOR gate 25, inverters 26, 27, 31, latch circuit 30, P channel transistor 28, and N channel transistor 29. When the power on reset signal PW1 generated when power is applied or the recovery signal PW2 from power down mode is supplied, the transistor 29 becomes conductive and the rough phase comparator enable signal S1 is put in the high active state. Also, when the rough phase comparator 19 detects lock on and sets the rough lock on signal JST-R high, the transistor 28 becomes conductive, the rough phase comparator enable signal S1 is put in the low inactive state, and the fine phase comparator enable signal S2 is put in the high active state.

Figure 6:
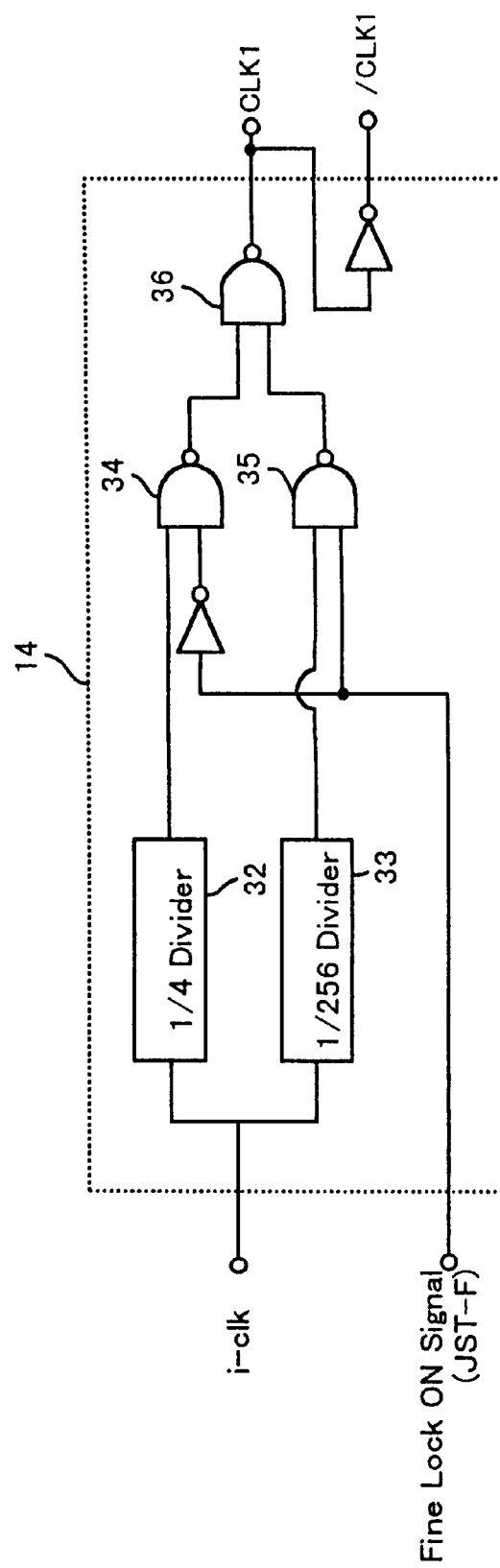
FIG. 6 is a circuit diagram of the divider.

FIG. 6 shows the constitution of the divider. The divider 14 comprises a divider 32 for dividing the frequency of the internal clock i-clk by 4 and a divider 33 for dividing into lesser quantities of 1/256. With the NAND gates 34, 35, 36, the clock CLK1, /CLK1 divided by either 4 or 256 is generated according to the fine lock on signal JST-F. Specifically, when the fine lock on signal JST-F is low, the clock divided by 4 is output; when the fine phase comparator 21 detects lock on and sets the fine lock on signal JST-F high, the clock divided by 256 is output.

Figure 7:
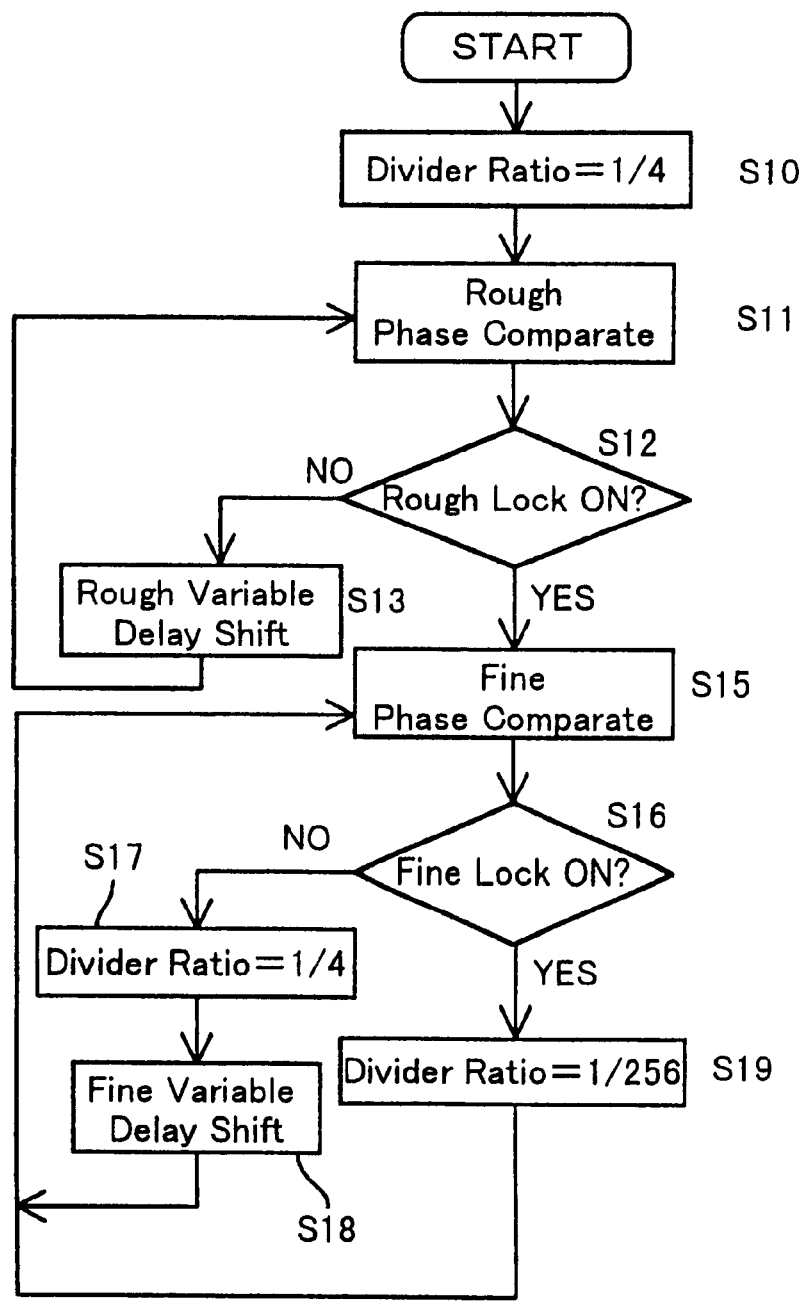
FIG. 7 is a flow chart showing phase adjustment in the first embodiment.

FIG. 7 is a flow chart showing phase adjustment with the first embodiment. When power is applied or when recovering from being powered down, the power on reset signal PW1 or power down recovery signal PW2 is supplied to the DLL controlling circuit 23. Accordingly, the rough phase comparator enable signal S1 is set high and the fine phase comparator enable signal S2 is set low. At this time, operation of the fine phase comparator 21 stops and the fine lock on signal JST-F remains low. Consequently, the divider 14 divides the internal clock i-clk by 4 and generates the clocks CLK1, /CLK1 (S10). Phase comparison is carried out only with the rough phase comparator 19 (S1). The results of the comparison by the rough phase comparator 19 are supplied to the rough delay controlling circuit 20. According to those comparison results, the rough delay controlling circuit 20 supplies the delay control signal N20 to the rough variable delay circuits 11, 15 and adjusts the delay amounts thereof in rough delay units (S13).

When the rough phase comparator 19 detects lock on, the phase comparator 19 sets the lock on signal JST-R high and supplies the signal to the DLL controlling circuit 23 (S12). In response to the lock on signal JST-R, the DLL controlling circuit 23 sets the rough phase comparator enable signal S1 low and stops phase comparison operations by the rough phase comparator 19 as shown in FIG. 5. As a result, the delay amounts of the rough variable delay circuits 11, 15 are fixed. Also, the DLL controlling circuit 23 sets the fine phase comparator enable signal S2 high and puts the fine phase comparator 21 in an active state. Consequently, from this point, phase comparison operations are carried out only by the fine phase comparator 21 (S15) and phase adjustment is carried out with the fine phase adjustment DLL circuit (S18).

In such phase adjustment, the fine delay controlling circuit 22 adjusts the delay amounts of the fine variable delay circuits 12, 16 according to the phase comparison results. In such phase adjustment, the delay amounts of the fine variable delay circuits are adjusted by increasing or decreasing by one the small delay units of the fine variable delay circuits 12, 16. During that time, the delay amounts in the rough variable delay circuits 11, 15 are set to the delay amounts at lock on. Therefore, even if the phases of the internal clock i-clk and so forth are temporarily shifted in this state, the consequent phase adjustment affects only the changes in the fine delay amounts. Fluctuation of the timing clock CLK12 can thereby be minimized.

When the fine phase comparator 21 detects lock on, the fine phase comparator 21 sets the lock on signal JST-F high (S16). As a result, the divider 14 generates the clock CLK1, /CLK1 divided by a lower rate of 256 (S19). Thereafter, the fine phase comparison operations and phase adjustment are effective over a longer cycle. In the first embodiment, upon the start of fine phase adjustment operations, the rough phase adjustment operations are stopped and the delay amounts of the rough variable delay circuits are set to the delay amounts at lock on. The delay amounts of the fine variable delay circuits are variably adjusted in fine delay units, which are smaller than rough delay units.

When the phase of the clock signal is shifted due to power source noise or the like, the fine phase comparator 21 shifts from the lock on state to lock off state, the fine lock on signal JST-F becomes low again, and the divider 14 outputs the quartered clock CLK1, /CLK1 (S17). The phase comparison and delay control are again carried out over the short cycle. In fine phase adjustment, therefore, fine phase comparison and delay control are carried out over the long cycle if locked on; with a shift from a locked on state, fine phase comparison and delay control are carried out over the short cycle. Consequently, in a stable state, phase adjustment due to temporary phase shifts of the clock signal is only carried out in fine delay units and phase adjustment in large delay unit such as rough delay units does not occur. Consequently, jitter in the timing clock can be reduced. And consequently, phase adjustment, which is more precise than with the prior art, becomes possible.

Next are explained examples of the basic constitution of the variable delay circuits 11, 15, 12, 16, phase comparators 19, 21, and delay controlling circuits 20, 21 comprising the timing clock generation circuit in FIG. 3.

Variable Delay Circuit

Figure 8:
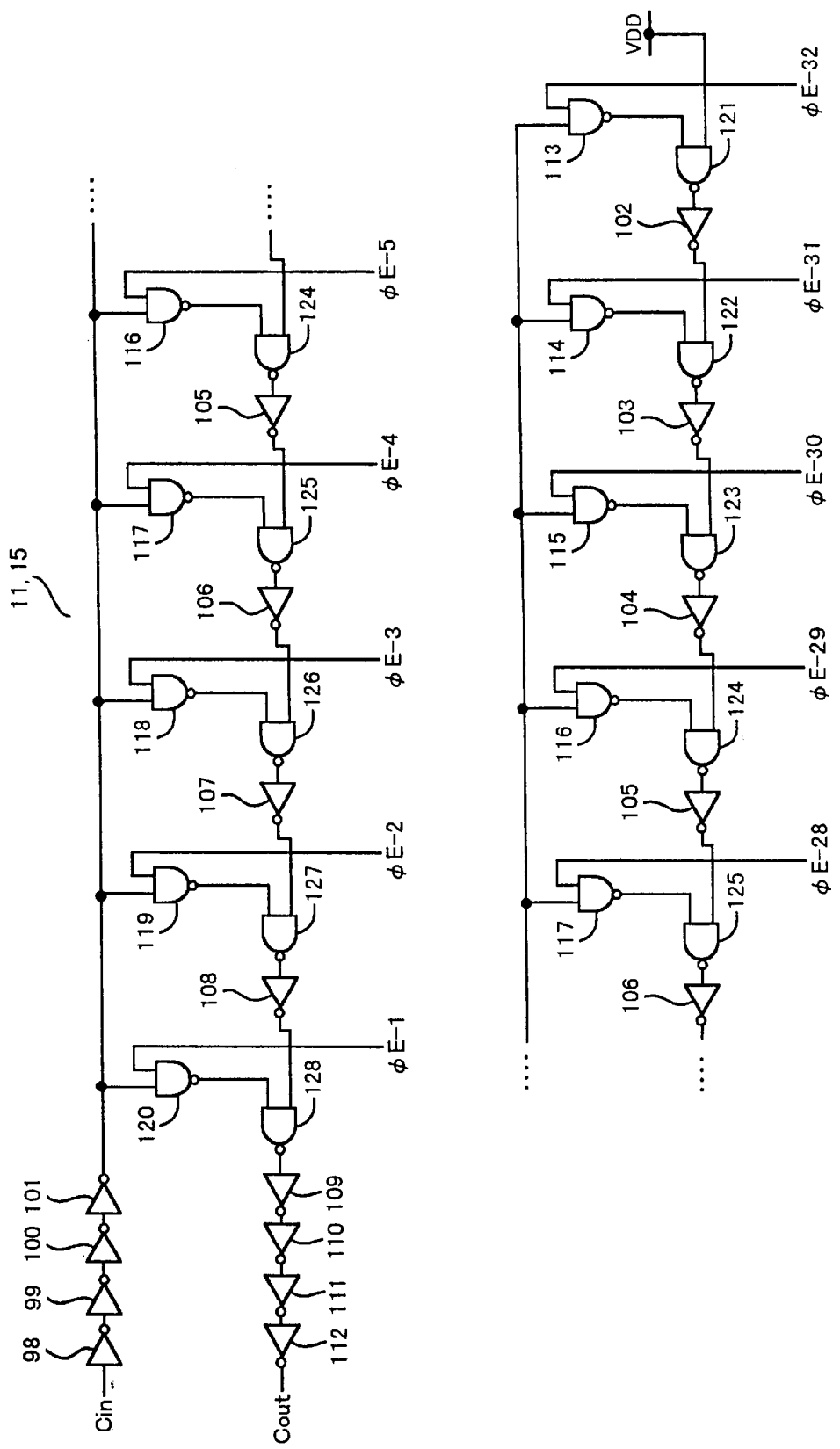
FIG. 8 shows a rough variable delay circuit.

FIG. 8 shows the rough variable delay circuits 11, 15. These rough variable delay circuits delay the input clock Cin and output an output clock Cout. The rough variable delay circuits 11, 15 comprise a plurality of inverters 98 to 112 and NAND gates 113 to 128 as shown. The clock, which is the delayed input clock Cin, is supplied to one input to the NAND gates 113 to 120 and the delay control signals $\phi_{E-1}$ to $\phi_{E-32}$ are supplied to the other input. One signal of the delay control signals $\phi_{E-1}$ to $\phi_{E-32}$ becomes high, and the remaining signals become low.

For example, when the delay control signal $\phi_{E-1}$ is set high and the other delay control signals become low, the output of all the NAND gates 113 to 199 becomes high. As a result, the NAND gates 121 to 127 all become low and the inverters 102 to 108 all become high. Then, the input clock Cin is delayed based on the delay amount of the total of ten stages of gates of the four inverters 98 to 101, NAND gates 120, 128, and four inverters 109 to 112, and is output as the output clock Cout. This state has the delay amounts in the minimum state.

When the high delay control signals $\phi_{E-1}$ to $\phi_{E-32}$ are shifted to the right in the figure, the delay amount of the two stages gate of the NAND gate 127 and inverter 108 are added. When the delay control signal $\phi_{E-32}$ becomes high, the delay amount becomes the maximum delay amount. Specifically, when the high delay control signal among the delay control signals $\phi_{E-1}$ to $\phi_{E-32}$ shifts to the right by one, the delay amount is increased by the two stages of NAND gate and inverter; when the high signal shifts to the left by one, the delay amount is decreased by two gates. The two stages delay amount corresponds to a rough delay unit.

Figure 9:
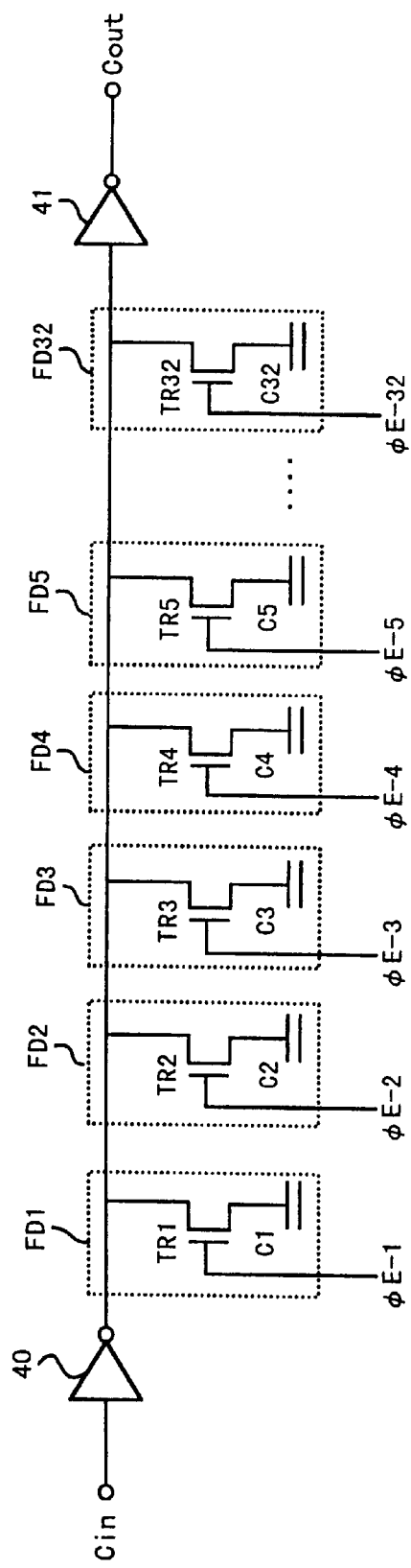
FIG. 9 shows a fine variable delay circuit.

FIG. 9 shows the fine variable delay circuit. The input clock Cin is delayed and the output clock Cout is generated. Delay circuits FD1 to FD32, comprising transistors TR and capacitors C, are established in 32 stages between the inverters 40, 41. The delay control signals $\phi_{E-1}$ to $\phi_{E-32}$ are supplied to each transistor TR. In the case of the fine variable delay circuits 12, 16, one of the delay control signals $\phi_{E-1}$ to $\phi_{E-32}$ at a controlled level from the first level becomes high, causing the transistor TR to conduct and connect the capacitor C. As a result, the upper level delay control signals from the above controlled level all become low and the transistors TR do not conduct. The delay time of each delay circuit FD corresponds to the fine delay unit.

Figure 10:
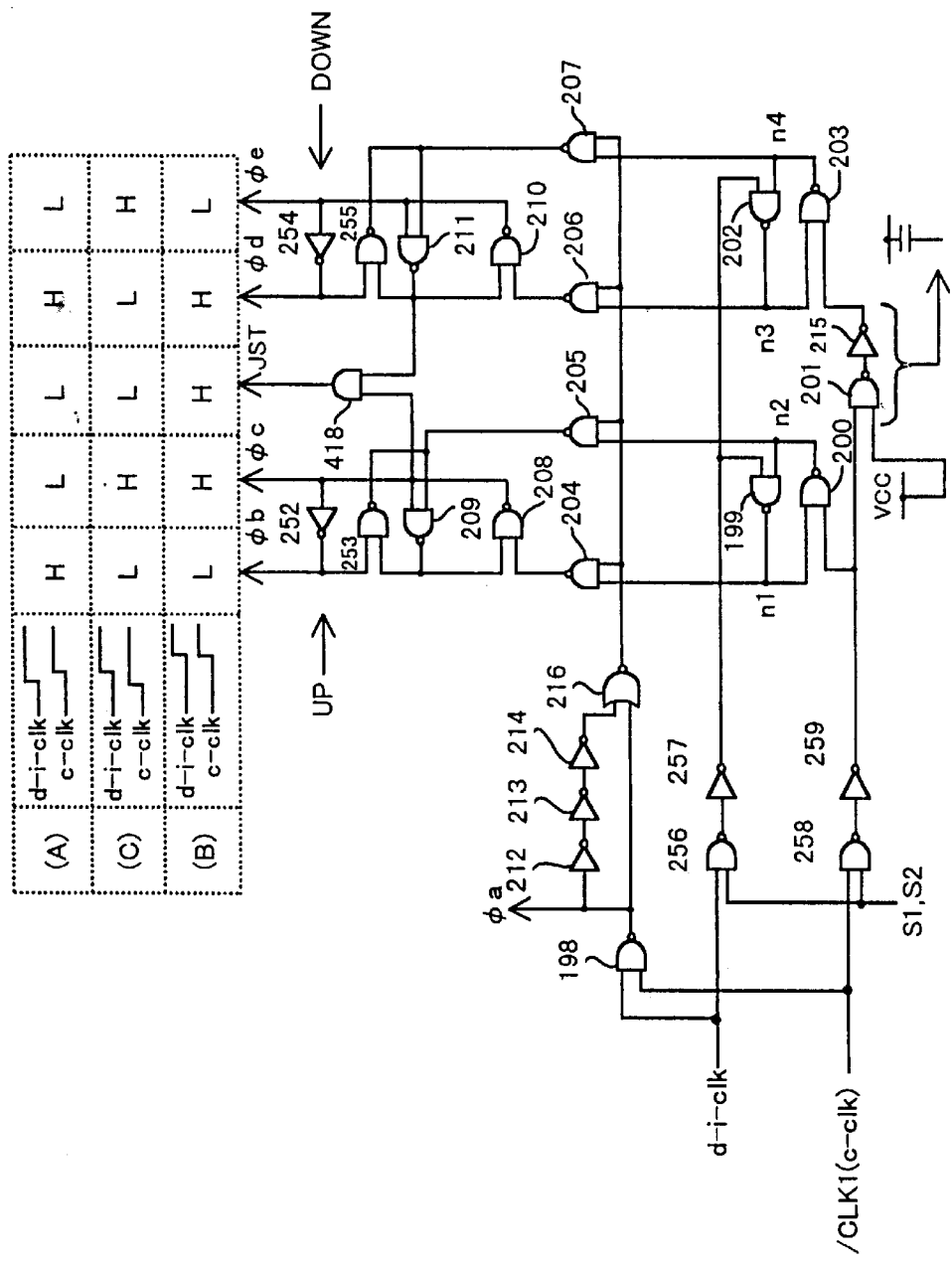
FIG. 10 is a circuit diagram of the phase comparing portion in the phase comparators 19, 21.
Figure 11A:
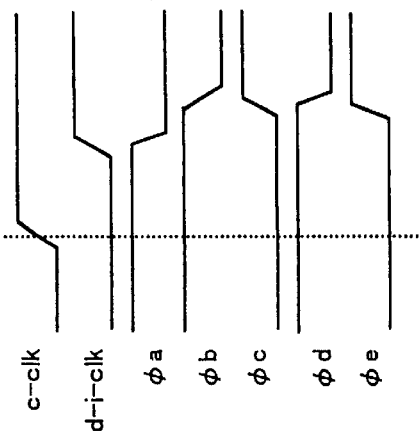
FIG. 11 is a waveform diagram showing the operation of the phase comparing portion in FIG. 10.
Figure 11B:
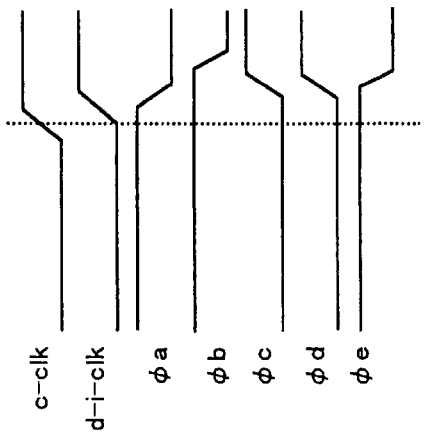
Figure 11C:
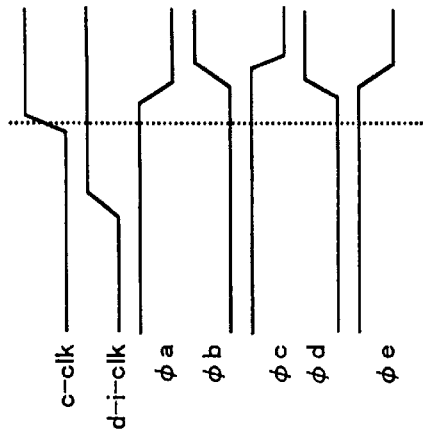

FIG. 10 is a circuit diagram of the phase comparison unit of phase comparison circuit 19, 21. Also, FIG. 11 is a waveform diagram showing the operation of the phase comparison unit. In this phase comparison unit, in the portion comprising NAND gates 199 to 203 and inverter 215, the phase relationship of the reference clock /CLK1 for the first input (herein after c-clk) and the variable clock d-i-clk for the second input is detected, and the detection results are generated at nodes n1 to n4. The phase relationship of the two clocks may be classified into the condition where the phase of variable clock d-i-clk leads reference clock c-clk, as shown in (A) of FIG. 11, the condition in which the phases of the two clocks are practically coincident, as shown in (B) of FIG. 11, and the condition in which the phase of the variable clock d-i-clk is delayed from that of the reference clock c-clk, as shown in (C) of FIG. 11.

In the case of the condition (A) of FIG. 11, in the condition where both clocks are L level, all of nodes n1 to n4 are H level; after this, the second clock d-i-clk first becomes H level:

n1=L, n2=H, n3=L, n4=H.

Even if subsequently the first clock c-clk becomes H level with a delay, the condition of the above nodes n1 to n4 does not change. When both clocks become H level, the output of NAND gate 198 becomes L level, causing an H level pulse of prescribed width from the falling edge thereof to be output from NOR gate 216. This H level pulse is supplied as sampling pulse to NAND gates 204 to 207, causing the conditions of nodes n1 to n4 to be respectively latched on a latch circuit consisting of NAND gates 208, 209 and a latch circuit consisting of NAND gates 210, 211. Consequently, as shown in FIG. 10, the signals $\phi$b, $\phi$c, $\phi$d, $\phi$e become: $\phi$b=H, $\phi$c=L, $\phi$d=H, $\phi$e=L.

In the condition (B) of FIG. 11, the phase of the second clock d-i-clk is delayed within the range of the delay time of NAND gate 201 and inverter 215 with respect to the first clock c-clk. In this case, the first clock c-clk becomes H level first, becoming:

n1=H, n2=L and, further, the output of inverter 215 becomes H level later than the second clock d-i-clk, becoming:

n3=L, n4=H.

Consequently, the two clocks are latched with the timing with which this goes to H level and, as shown in the Table of FIG. 10, the signals $\phi$b, $\phi$c, $\phi$d, $\phi$e become:

$\phi$b=L, $\phi$c=H, $\phi$d=H, $\phi$e=L.

This case signifies that the phases are coincident, so the lock-on signal JST of the output of AND gate 418 also outputs H level.

In the condition (C) of FIG. 11, the first clock c-clk first becomes H level, whereupon n1=H, n2=L, n3=H, n4=L.

Thereafter, even if there is a lag in the second clock d-i-clk becoming H level, the conditions of the nodes n1 to n4 do not change. This condition is latched with the timing with which both clocks become H level, and, as shown in the Table of FIG. 10, signals φb, φc, φd, φe become:

φb=L, φc=H, φd=L, φe=H.

As above, the gates 201, 215 correspond to one stage delay of the variable delay circuit. In the case of the fine phase comparator, therefore, these gates 201, 215 are replaced with capacitors. Also, signals S1, S2 are applied to gates 256, 258, the clock input is suppressed, and the phase comparison operation is suppressed.

Figure 12:
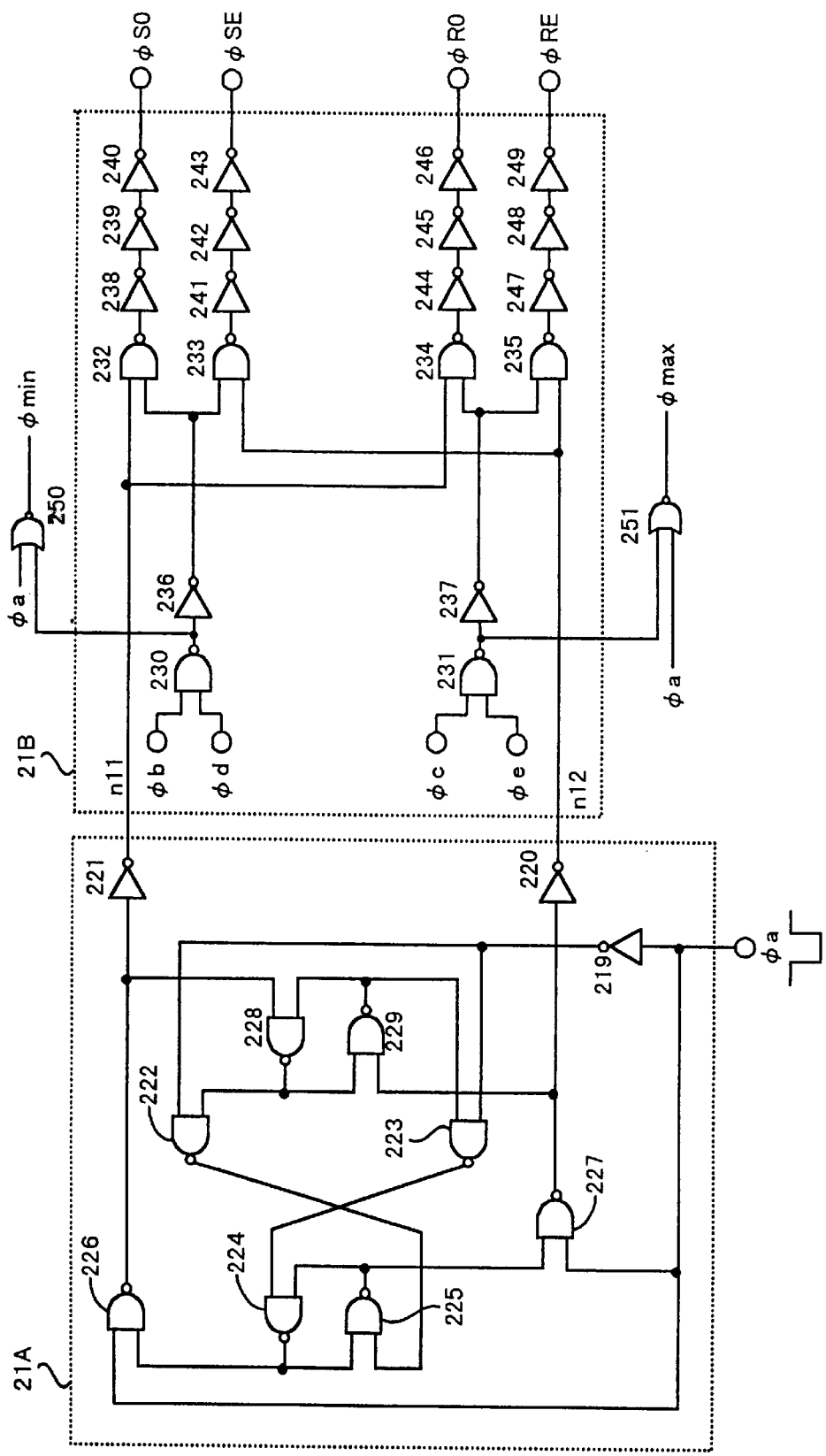
FIG. 12 is a circuit diagram of the phase comparison output portion in the phase comparators 19, 21.

FIG. 12 is a circuit diagram of the phase comparison output unit of phase comparison circuit 19, 21. Also, FIG. 13 is a waveform diagram showing the operation of this phase comparison output unit. (A), (B), (C) of the waveform diagram respectively correspond to (A), (B), (C) of FIG. 10 and FIG. 11.

The phase comparison output unit comprises a frequency dividing circuit 21A that divides to one half the frequency of the timing signal φa generated with the timing of the phase comparison of the two clocks, and an output circuit 21B that outputs phase comparison result signals φSO to φRE based on the signals φb, φc, φf, φe generated in accordance with the phase relationship of the two clocks in response to the timing of output from this frequency dividing circuit 21A.

Divide-by-two frequency division circuit 21A is constituted by a JK flip-flop; the time when both clocks c-clk, d-i-clk become H level is detected by NAND gate 198 (FIG. 10), and the sampling pulse φa which is obtained therefrom is divided in frequency by a factor of 2, thereby generating inverse-phase pulse signals n11 and n12. Sampling pulse φa is supplied to gates 226 and 227 and its inverted pulse /φa is supplied to gates 222, 223, an inverted signal being transferred between the latch circuit consisting of gates 228 and 229 and the latch circuit consisting of gates 224, 225. As a result, inverted-phase pulse signals n11, n12 that have been divided in frequency by a factor of 2 are generated.

Output circuit 21B decodes the signals φb, φc, φd, φe that are sampled and latched; if the phase of the first clock c-clk (CLK1, /CLK1) lags that of the second clock d-i-clk (condition (A)), it makes the output of inverter 236 H level; if the phases of the two clocks coincide (condition (B)), it makes both the outputs of inverter 236 and 237 L level; and, if the phase of first clock c-clk leads that of the second clock d-i-clk (condition (c)), it makes the output of inverter 237 H level.

Figure 13A:
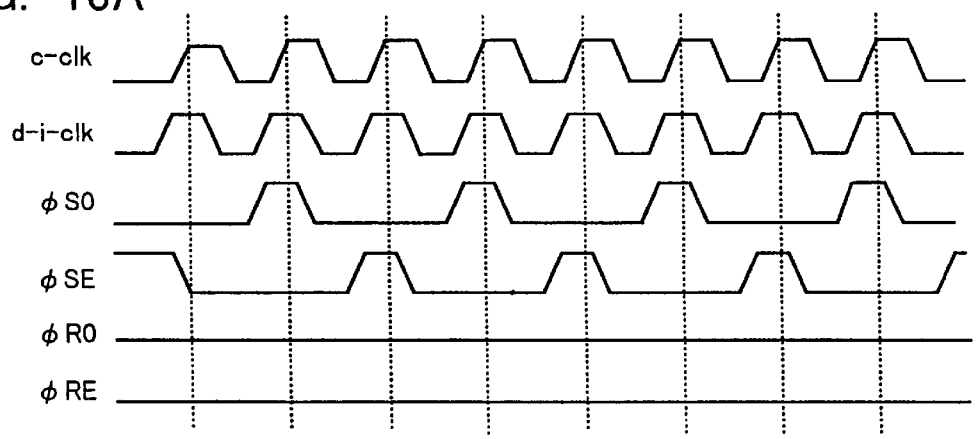
FIG. 13 is a waveform diagram showing the operation of the phase comparison output portions in FIG. 12.
Figure 13B:
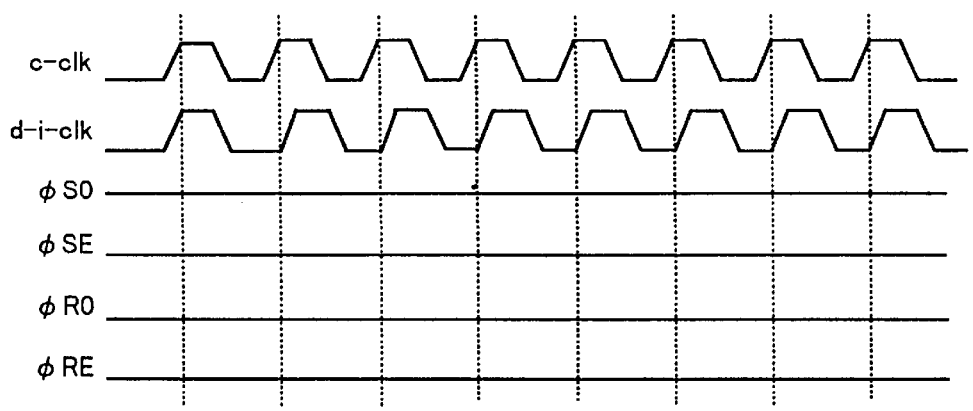
Figure 13C:
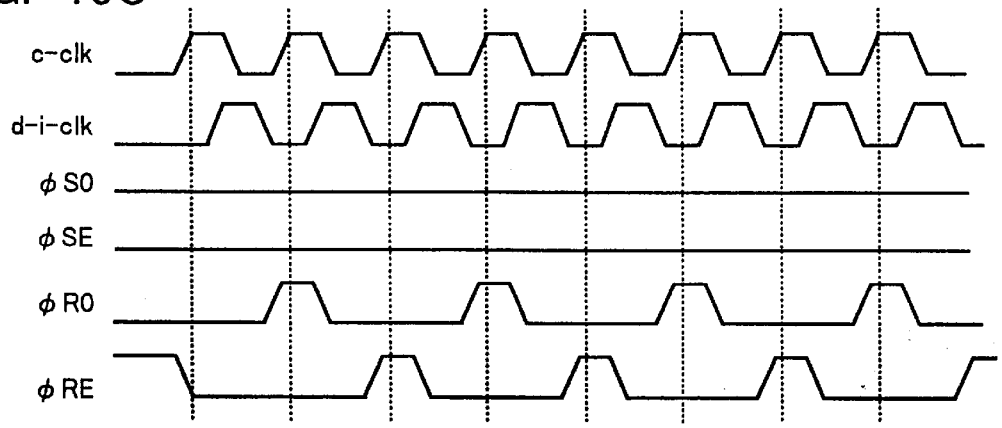

Consequently, in output circuit 21B, by means of the decoding function of NAND gates 232 to 235, when in condition (A) mentioned above, NAND gates 232 and 233 alternately make the phase comparison result signals φSO, φSE that increase the delay amount of variable delay circuit 13 H level so as to delay the phase of the second clock d-i-clk in response to the timing signals n11, n12. Specifically, this is as shown in FIG. 13A. But, in condition (B), output circuit 21B, as shown in FIG. 13B, does not generate phase comparison result signals φSO to φRE. Furthermore, in condition (C), as shown in FIG. 13C, NAND gates 234, 235 alternately make the phase comparison result signals φRO, φRE which decrease the amount of delay of variable delay circuit 13 H level in order to advance the phase of the second clock d-i-clk in response to timing signals n11, n12.

Delay Control Circuit

Figure 14:
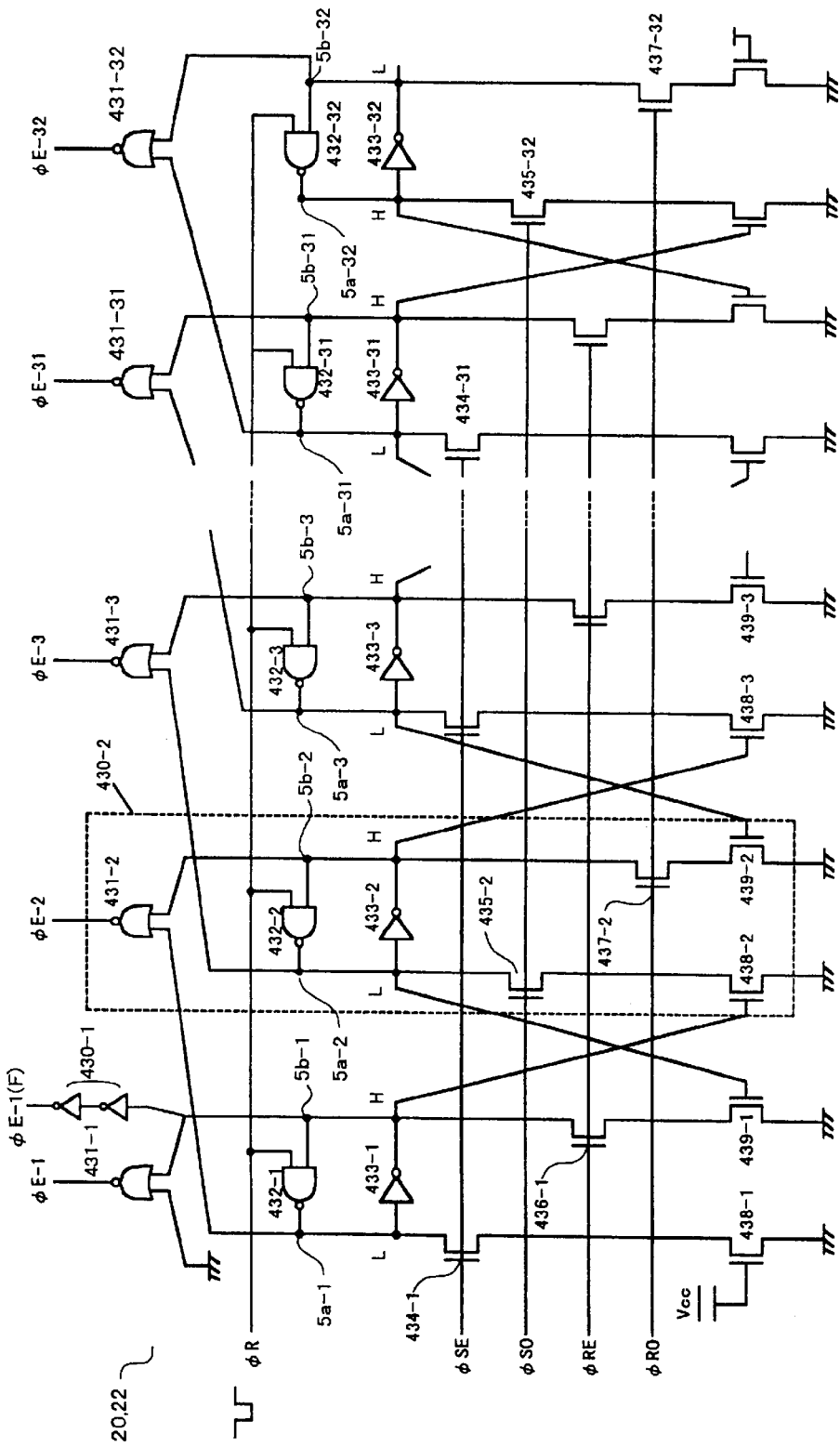
FIG. 14 is a circuit diagram of a delay control circuit.

FIG. 14 is a circuit diagram illustrating part of the layout of rough and fine delay control circuit. Delay control circuit 20 outputs delay control signals φE-1 to φE-3 from NOR gates 431-1 to 431-3 in response to phase comparison result signals φSO to φRE. As shown in FIG. 8, delay control signals φE-1~φE-32 are constituted by 32 bits.

Delay control circuit, in response to phase comparison result signals φSO, φSE, shifts the H-level delay control signal φE to the right, thereby increasing the amount of delay of the variable delay circuit, and, in response to phase comparison result signals φRO, φRE, shifts the H level delay control signal φE to the left, thereby decreasing the amount of delay of the variable delay circuit.

Each stage of the delay control circuit is respectively provided with a latch circuit consisting for example in the case of the first stage in NAND gate 432-1 and inverter 433-1. It is also provided with transistors 434-1, 436-1 that forcibly invert the condition of latch circuits 432-1 and 433-1 in response to the phase comparison result signals φSO to φRE. Transistors 438-1, 439-1 are provided in order to ensure that latch circuits other than those which are intended to be inverted are not inverted by transistors 434-n, 436-n. The second stage and third stage circuits are constructed in the same way. All these transistors are N-channel type.

Assuming now that when reset signal φR constituted by an L level pulse is applied, the outputs of NAND gates 431-1 to 3 all become H level, all the outputs of inverters 433-1 to 3 become L level. Node 5a-2 therefore becomes L level, and the delay control signal φE-1 of the output of NOR gate 431-1 becomes H level. Also, since node 5a-1, 5a-3 are both H level, the delay control signals φE-2, φE-3 other than these all become L level. That is, in response to the reset signal φR, the delay control signal φE-1 becomes H level, and the variable delay circuits 11, 15 are controlled to the minimum delay time.

Next, when phase comparison is executed, one or other of the phase comparison result signals φSO to φRE becomes H level, depending on the phase relationship of the two clocks. Let us now assume that when phase comparison result signal φSE becomes H level, transistor 434-1 conducts, forcibly pulling node 5a-1 down to L level and forcibly pulling node 5a-2 of the output of inverter 433-1 up to H level. As a result, the output φE-1 of NOR gate 431-1 becomes L level. Also, since both node 5a-1 and 5a-4 are L level, the output φE-2 of NOR gate 431-2 becomes H level. The first-stage and second-stage latch circuits are then held in this condition. Furthermore, when the phase comparison result signal φSO is made H level by subsequent phase comparison, by an identical action, node 5a-3 and 5a-6 both become L level, and the delay control signal φE-3 becomes H level. In this way, delay control signal φE is shifted to the right by means of the phase comparison result signals φSE and φSO, such that the delay time becomes longer.

Contrariwise, by an action opposite to that described above, the delay control signal φE is shifted to the left such as to make the delay time shorter by means of phase comparison result signals φRE and φRO. As will be clear from the operation of the output unit of the phase comparison circuit described above, the phase comparison result signals φSE and φSO are generated alternately every time a phase comparison is effected when the second clock d-i-clk is leading, and phase comparison result signals φRE and φRO are generated alternately every time a phase comparison is effected when the second clock d-i-clk is lagging.

Also, in response to the phase comparison result signals φSE and φSO, the delay control signal φE shifts successively rightwards until finally delay control signal φE-32 becomes H level. In this condition, the output of inverter 433-32 is latched at L level and the output of NAND gate 432-32 is latched at H level. Thereupon, when, further, a comparison result signal φSO extending the delay time is supplied, the output of NAND gate 432-43 is pulled down to L level, and the output of inverter 433-32 is pulled up to H level.

The rough delay controlling circuit 20 was explained above. In the case where circuit shown in FIG. 14 is used as the fine delay controlling circuit 22, two inverters 430-1 are connected to the node 5b-1, instead of NOR gates 431-1 to 431-32. Furthermore, the same inverters are connected to nodes 5b-n (n is integer) in each level. As a result, the fine delay control signals φE-n (F) generated all become high up to the signal corresponding to a given level from the first level; the remaining signals to the end all become low.

Second Embodiment

Figure 15:
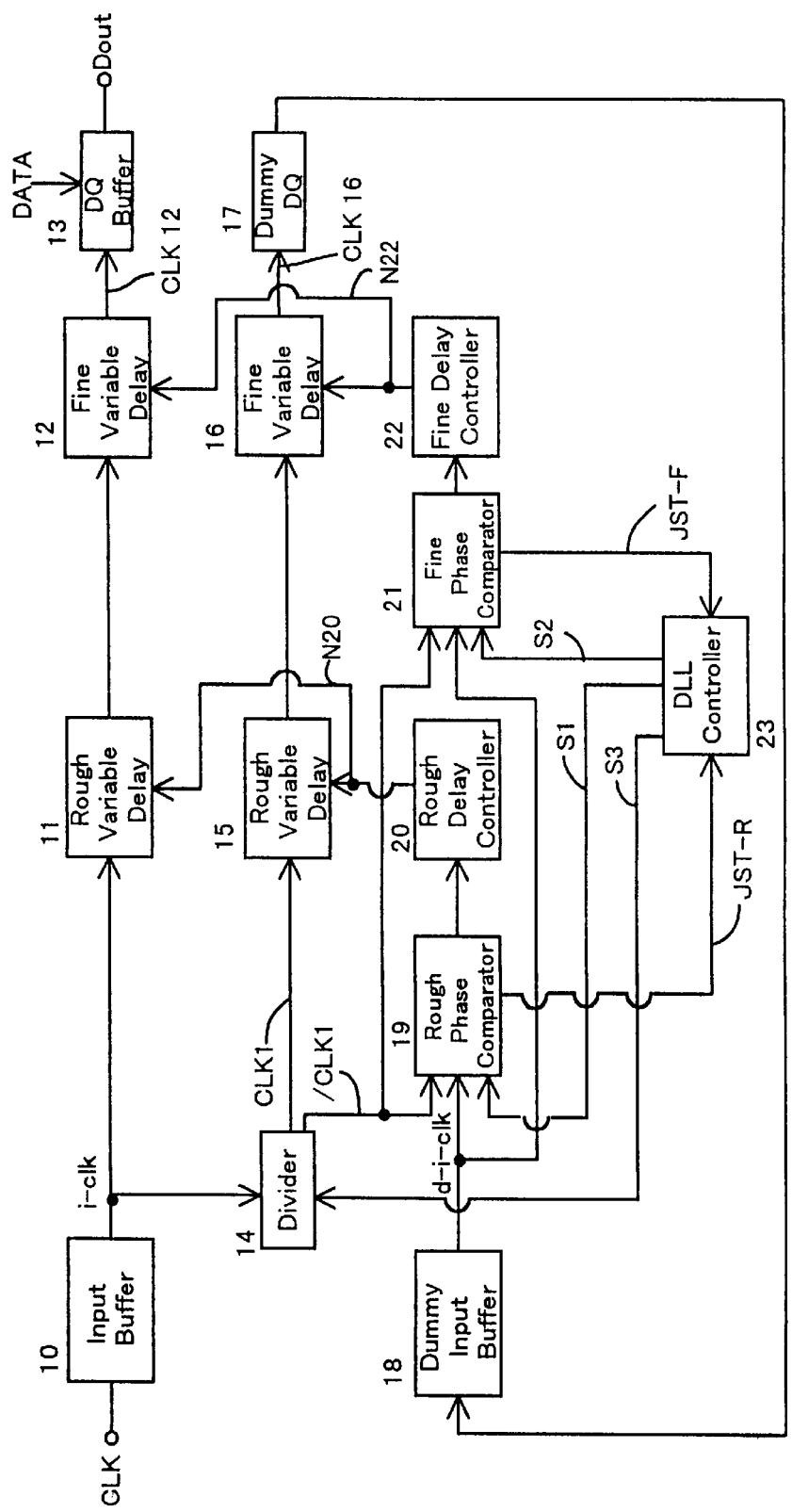
FIG. 15 shows the constitution of the timing clock generation circuits relating to the second and third embodiments.

FIG. 15 shows the constitution of the timing clock generation circuit relating to the second and third embodiments. The same call-outs are used for elements corresponding to elements in FIGS. 1 and 3. The second embodiment in FIG. 15 is different from the first embodiment in FIG. 3 in regards to the fine lock on signal JST-F being supplied from the fine phase comparator 21 to the DLL controlling circuit 23, and in regards to the DLL controlling circuit stopping the division operation of the divider 14 upon receiving both the rough lock on signal JST-R and the fine lock on signal JST-F. Other than that, the second embodiment has the same constitution as the first embodiment.

Figure 16:
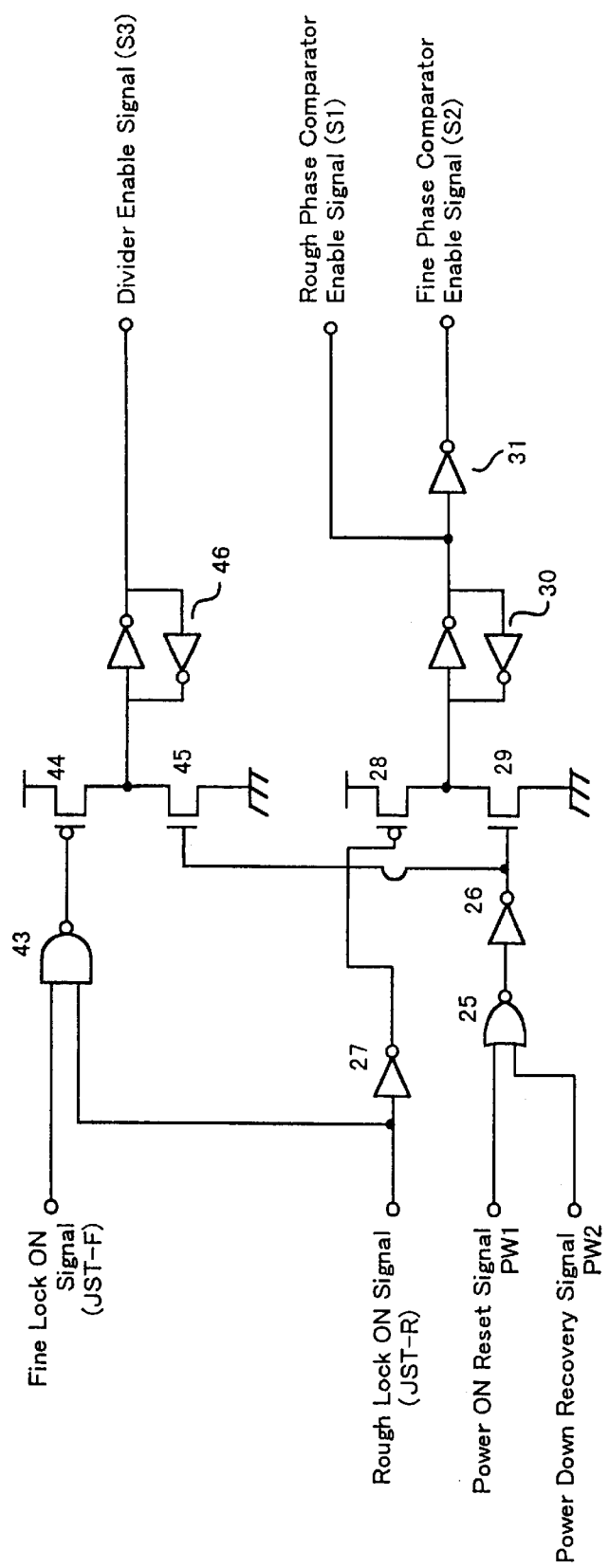
FIG. 16 shows the DLL controlling circuit relating to the second embodiment.

FIG. 16 shows the DLL controlling circuit relating to the second embodiment. In addition to the constitution of the DLL controlling circuit relating to the first embodiment shown in FIG. 5, this DLL controlling circuit includes a NAND gate 43, transistors 44, 45, and a latch circuit 46. The rough lock on signal JST-R and fine lock on signal JST-F are supplied to the NAND gate 43; when both signals become high, the transistor 44 conducts and the divider enable signal S3 becomes high, stopping the division operation of the divider.

Figure 17:
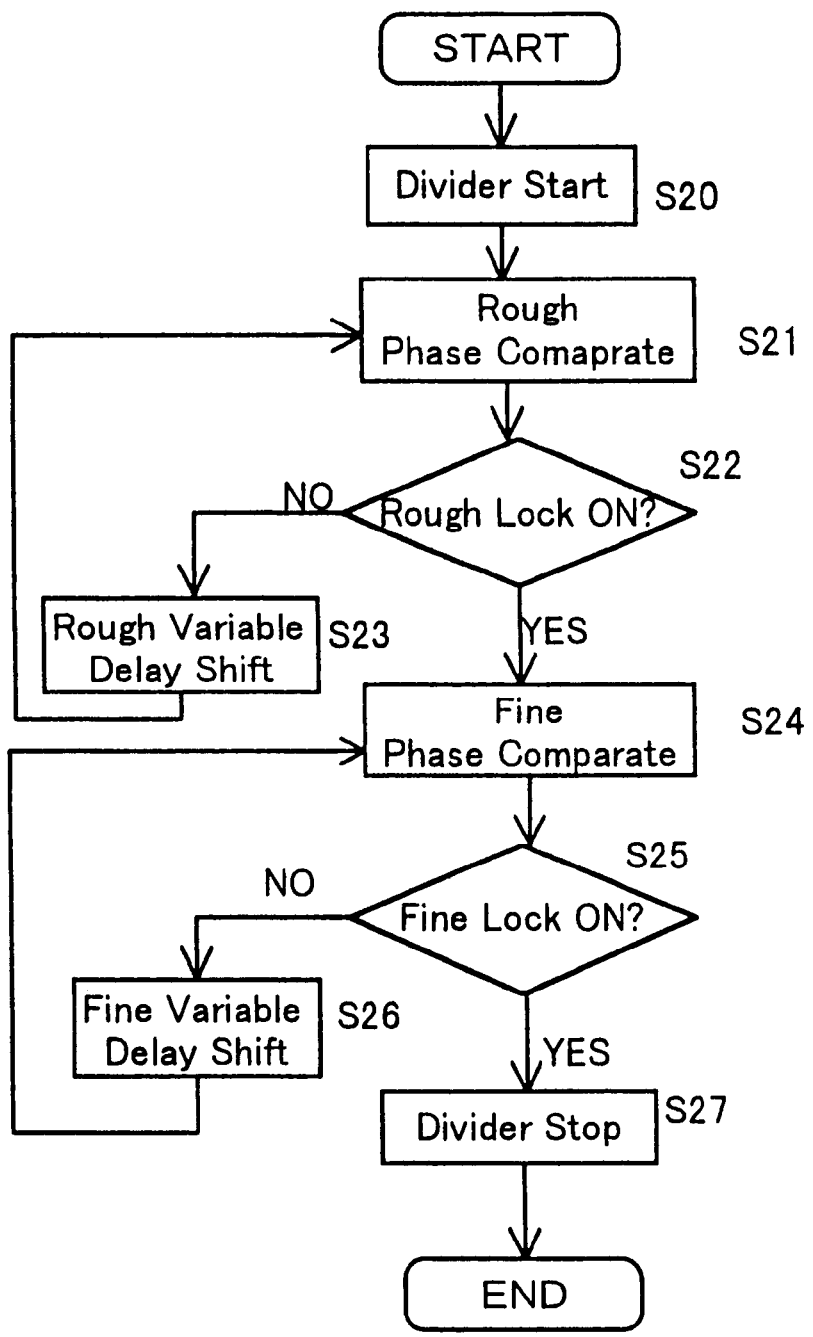
FIG. 17 is a flow chart showing phase adjustment in the second embodiment.

FIG. 17 is a flow chart showing phase adjustment with the second embodiment. Below, phase adjustment with the second embodiment is explained using FIGS. 16 and 17.

With the DLL controlling circuit 23 relating to the second embodiment, the output of the inverter 26 becomes high when either the power on reset signal PW1 or the power down recovery signal PW2 becomes high. The transistor 45 conducts, the divider enable signal S3 becomes high, and the divider 14 starts the operation of dividing by 4, for example (S20). At the same time, the rough phase comparator enable signal S1 becomes high due to the conduction of the transistor 29 and the rough phase comparator 19 carries out the phase comparison operation (S21). As a result, the rough phase comparator 19 compares the phase of the internal clock i-clk with the quartered clock when phase adjustment begins; the rough delay controlling circuit 20 adjusts the delay amount of the rough variable delay circuits 11, 15 according to the phase comparison results (S23). Because the transistor 29 is in a conductive state when phase adjustment begins, the fine phase comparator enable signal S2 is low and phase comparison operations by the fine phase comparator 21 are halted. As in the first embodiment, phase comparison is halted without the reference clock /CLK and variable clock d-i-clk being supplied to the fine phase comparator 21.

When the rough phase comparator 19 detects rough lock on, the phase comparator 19 sets the rough lock on signal JST-R high (S22). As a result, the transistor 28 in the DLL controlling circuit in FIG. 16 is conductive, inverting the state of the latch circuit 30, setting the rough phase comparator enable signal S1 low, and setting the fine phase comparator enable signal S2 high. As a result, the phase comparison operations by the rough phase comparator 19 are halted, the delay amounts of the rough variable delay circuits 11, 15 are set in the lock on state, and phase comparison operations by the fine phase comparator 21 begin (S24). After that, according to the phase comparison results from the fine phase comparator 21, the fine delay controlling circuit 22 generates the delay controlling signal N22 and adjusts the delay amounts of the fine variable delay circuits 12, 16 (S26).

When the fine phase comparator 21 detects fine lock on, the fine lock on signal JST-F also becomes high. Inside the DLL controlling circuit 23, as a result, the output of the NAND gate 43 becomes low, the transistor 44 conducts, the latch circuit 46 is inverted, and the divider enable signal S3 becomes low. As a result, the division operation by the divider 14 is halted. Consequently, the delay amounts of the rough variable delay circuits 11, 15 and the delay amounts of the fine variable delay circuits 12, 16 are all set at the delay amounts at lock on. For this reason, even when the phases of the external clock CLK and the internal clock i-clk are temporarily shifted afterwards due to power source noise or the like, the phase of the timing clock is not accordingly shifted because the delay amounts of the variable delay circuits are fixed. In other words, a timing clock CLK12 without jitter can be provided to the data output buffer 13 of the internal circuits.

Third Embodiment

Figure 18:
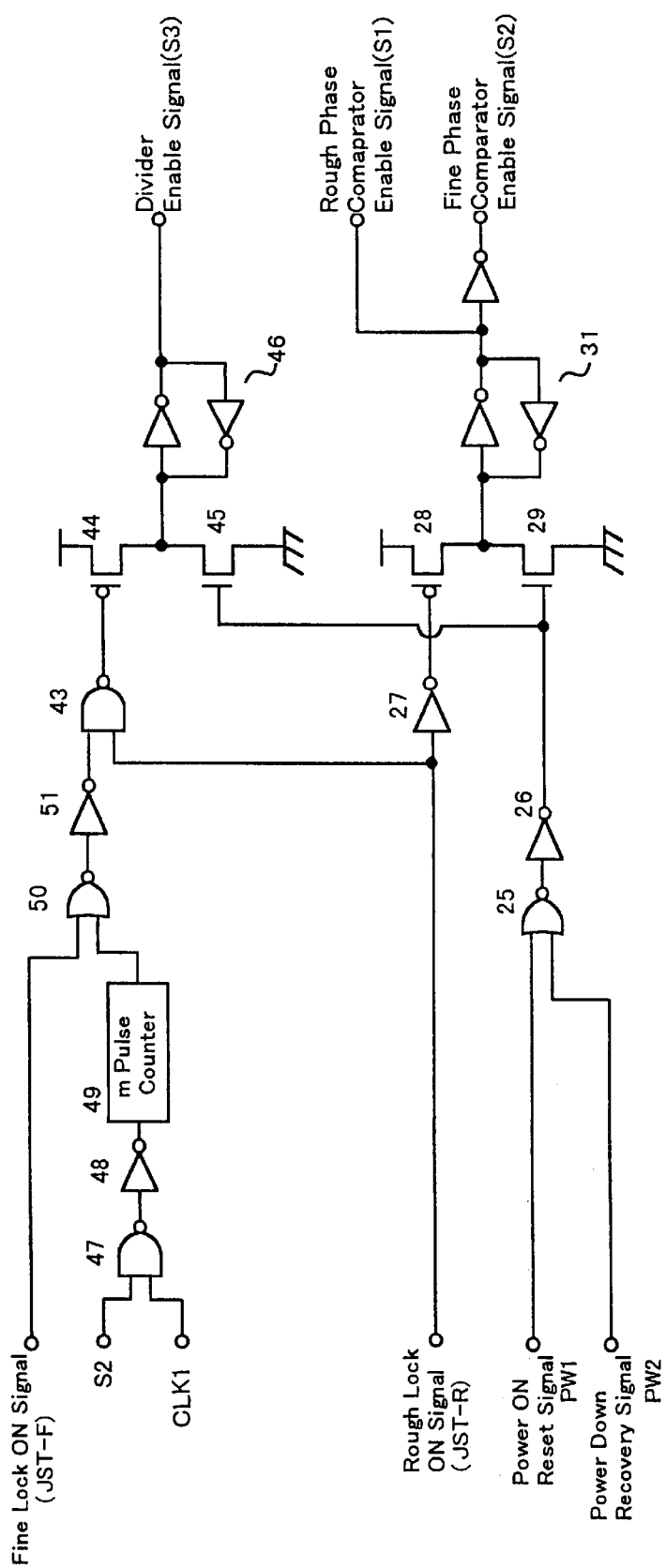
FIG. 18 shows the DLL controlling circuit relating to the third embodiment.
Figure 19:
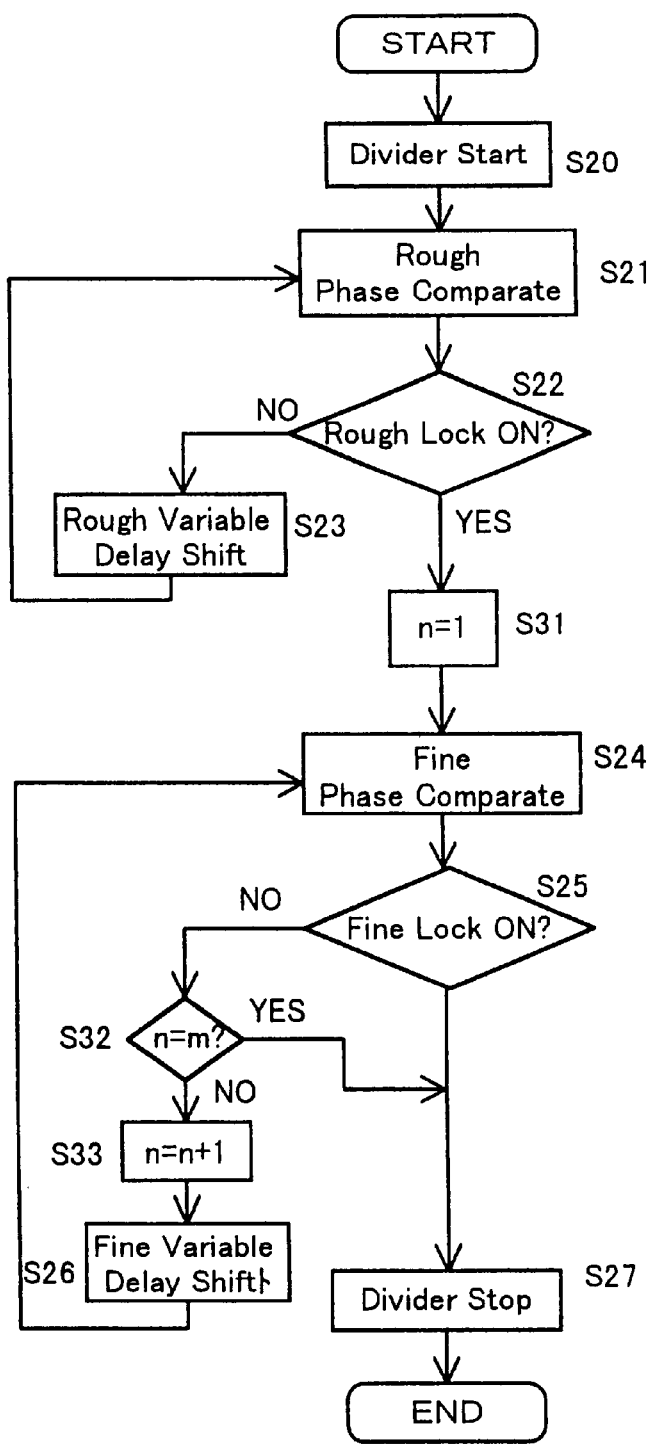
FIG. 19 is a flow chart showing phase adjustment in the third embodiment.

FIG. 18 shows the DLL controlling circuit relating to the third embodiment. FIG. 19 is a flow chart of phase adjustment with the third embodiment. Furthermore, FIG. 15 shows the constitution of the timing clock generation circuit relating to the third embodiment.

As shown in FIG. 18, the DLL controlling circuit 23 in the third embodiment includes a pulse counter 49 for counting the clock/CLK1 while the fine phase comparator enable signal S2 is high. When the fine lock on signal JST-F becomes high or the pulse counter 49 counts m number of clocks/CLK1, the divider enable signal S3 becomes low and the operation of the divider 14 is halted. As a result, the phase comparison operations of the fine phase comparator 21 are also halted.

The flow chart in FIG. 19 includes steps S31, S32, S33 in addition to the steps in the second embodiment; the conditions where the divider is halted (S27) are at fine lock on, as well as when the fine phase comparator 21 has made m number of phase comparisons. The operation is explained below.

From when phase adjustment begins until the rough phase comparator 19 locks on, the phase adjustment operations are the same as the first and second embodiments. When the rough phase comparator 19 locks on (S22), the rough lock on signal JST-R becomes high. At this time, the rough phase comparator enable signal S1 is set low and the fine phase comparator enable signal S2 is set high as shown in FIG. 18. The operation of the rough phase comparator 19 thereby stops and the phase comparison operations of the fine phase comparator 21 begin (S24). After that, phase comparison is performed only by the fine phase comparator 21. Consequently, the delay amounts of the rough variable delay circuits 11, 15 are set at the values when the rough phase comparator 19 locked on.

The m pulse counter 49 in the DLL controlling circuit 23 is reset to one when phase adjustment begins (S31). After that, with the generation of the rough lock on signal JST-R, the fine phase comparator enable signal S2 is set high and the fine phase comparator 21 begins phase comparison. Accordingly, the input of the quartered clock signal/CLK1 to the m pulse counter 49 begins as shown in FIG. 18 (S33).

While the fine phase comparator is not locked on, the fine variable delay circuits 12, 16 are each shifted by one level by the fine delay controlling circuit 22 (S26). At this time, the counter value of the m pulse counter 49 shows the number of times the phase comparison operation is performed, that is, the delay element level number of the fine variable delay circuits 12, 16 shifted by the fine delay controlling circuit 22. Also, the maximum count value m of the pulse counter is established to be close to the number of delay element levels in the fine variable delay circuits 12, 16. Consequently, if the fine phase comparison operations are performed m times, the fine variable delay circuits 12, 16 can be thought to be set at a delay amount approximating the lock on state of the fine phase comparator 21. In the case where the fine phase comparator 21 locks on before the fine phase comparator operations have been performed m times (S25), subsequent operations are the same as in the second embodiment. In the case where the fine phase comparator 21 does not lock on even when the fine phase comparator operations have been performed m times (S32), the delay amount of the fine variable delay circuits appears to be set at a delay amount approximating the lock on state of the fine phase comparator 21 and the output signal from the m pulse counter becomes high. The divider enable signal S3 is thereby set low and the phase adjustment operation for the clock signal is stopped (S27).

The internal clock signal c-clk is delayed by means of the rough variable delay circuit 11 and fine variable delay circuit 12, for which the delay amounts are set in the abovementioned phase adjustment, and is supplied to the data output buffer 13 as the timing clock CLK12. The data output buffer 13 synchronizes with the clock signal CLK12 supplied, takes up data DATA from inside the device, and outputs the data outside the device.

With the third embodiment, fine phase adjustment is sometimes carried out over a long cycle of time without complete lock on occurring, in the case where slight fluctuations are present in the external clock CLK itself, even if phase adjustment is carried out from the first fine phase adjustment level until reaching a state close to the lock on state. In these fine phase adjustment operations, the delay amount of the fine variable delay circuits is changed and fluctuation (jitter) continues to occur in the phase of the timing clock CLK12 generated. Consequently, in the third embodiment, fine phase adjustment operations are found to approximate the lock on state if fine phase adjustment operations are repeated a certain number of times; this forces operations by the divider 14 to stop and the fine phase adjustment is also ended. As a result, the delay amounts of both variable delay circuits 11, 12 are fixed and fluctuation in the timing clock CLK12 is eliminated. Consequently, the maximum count value m for the counter 49 is preferably set to a number of fine delay units corresponding to a rough delay unit. Accordingly, fine phase adjustment is completed inside of a rough delay unit within the count value m times.

The m pulse counter 49 in the third embodiment can be used in the first embodiment as well. Specifically, steps S32 and S33 from the third embodiment are inserted between steps S17 and S18 in the flow chart in FIG. 7 for the first embodiment. Consequently, in the first embodiment, fine phase adjustment is started after rough phase adjustment locks on; when phase adjustment is carried out with m times of fine phase comparison without locking on, the division rate of the divider 14 is forced down to 1/256. The period of fine phase adjustment in a short cycle of time is thereby kept from becoming needlessly long.

Fourth Embodiment

Figure 20:
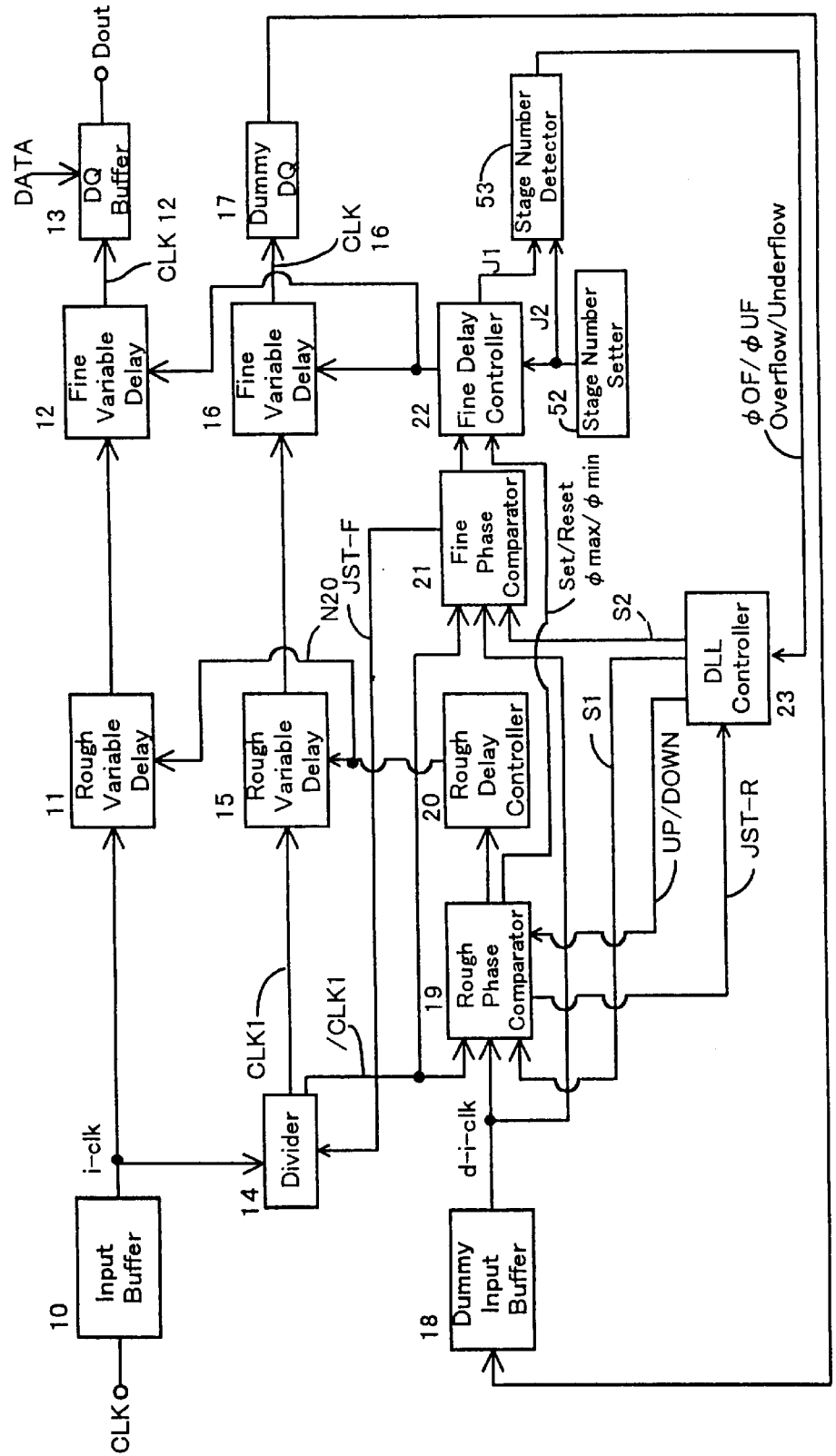
FIG. 20 shows the constitution of the timing clock generation circuit relating to the fourth embodiment.
Figure 21:
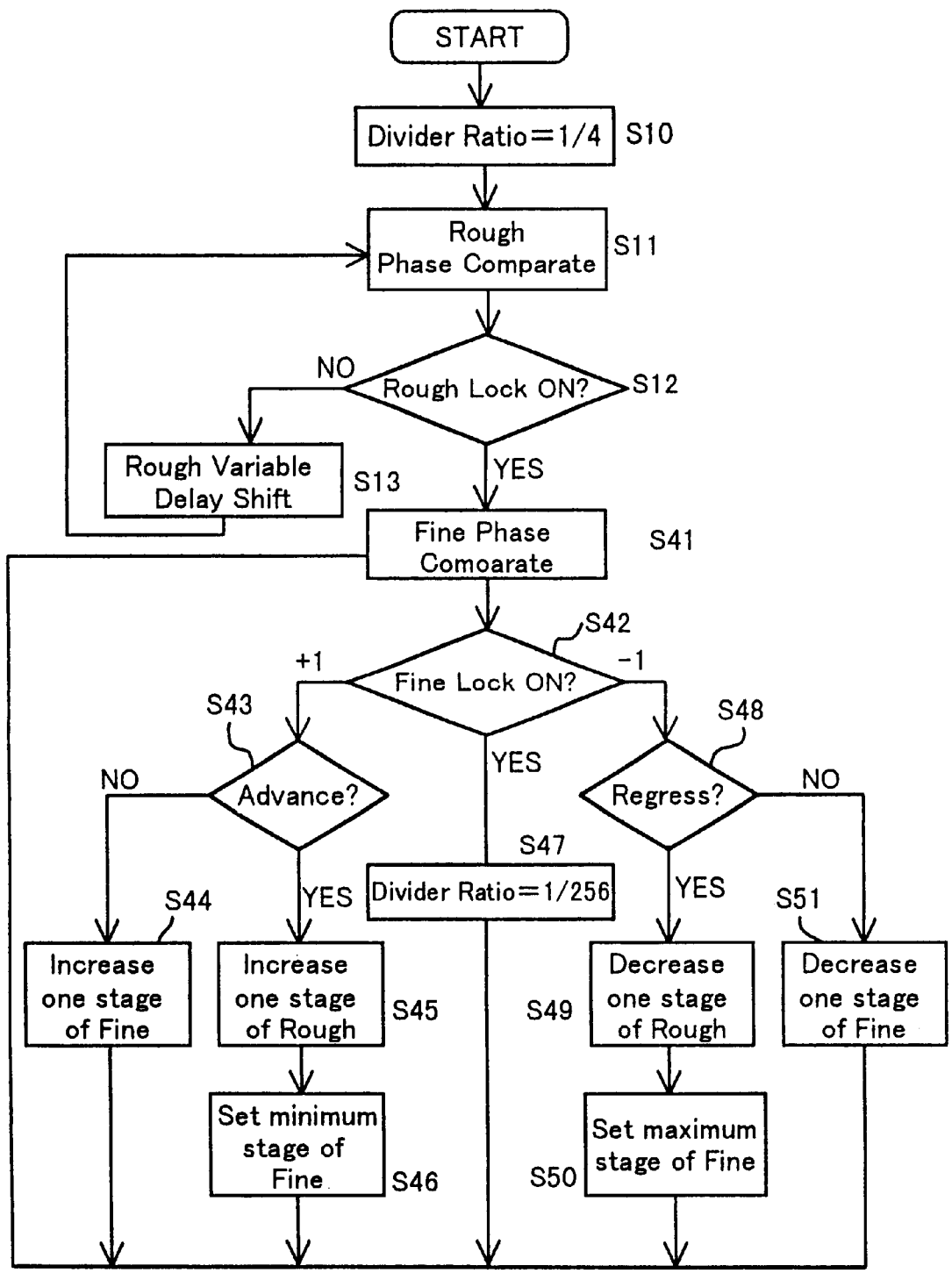
FIG. 21 is a flow chart showing phase adjustment in the fourth embodiment.

FIG. 20 shows the constitution of the timing clock generation circuit relating to the fourth embodiment. FIG. 21 is a flow chart showing phase adjustment therewith. The constitution in FIG. 20 further includes a stage number setting circuit 52 and stage number detecting circuit 53 are added. In addition, the stage number detecting circuit 53 supplies the overflow signal $\phi$OF and underflow signal $\phi$UF to the DLL controlling circuit 23; the DLL controlling circuit 23 supplies the up signal UP and down signal DOWN to the rough phase comparator 19; and the rough phase comparator 19 supplies the set signal $\phi$max and reset signal $\phi$min to the fine delay controlling circuit 22. Otherwise, the constitution is the same as in the first embodiment in FIG. 3.

In the fine phase comparison operation, the fourth embodiment performs processing for advancing or regressing the delay amount of the rough variable delay circuit according to the delay stage number used in the fine variable delay circuit. In other words, the phase adjustment operation is the same as the first through third embodiments from the start of phase adjustment until the rough phase comparator 19 locks on. Once the rough phase comparator 19 locks on, the high level rough lock on signal JST-R is supplied to the DLL controlling circuit 23. At that time, the rough phase comparator enable signal S1 is set low and the fine phase comparator enable signal S2 is set high. The operation of the rough phase comparator 19 is thereby stopped and the fine phase comparator 21 begins the phase comparison operation.

After that, phase comparison is carried out with only the fine phase comparator 21 as shown in FIG. 12 (S41 to S51). The comparison results of the fine phase comparator 21 are output to the fine delay controlling circuit 22. The fine delay controlling circuit 22 adjusts the delay amounts of the fine variable delay circuits 12, 16 on the basis of the phase comparison results. The delay stage J1 of the fine variable delay circuits 12, 16 set at this time is supplied from the fine delay controlling circuit 22 to the stage number detecting circuit 53 as shown in FIG. 20. In the present embodiment, the stage number setting circuit 52, discussed below, measures the stage number of the delay units of the fine variable delay circuits corresponding to one stages of the delay units of the rough variable delay circuits 11, 15. The measured stage number is supplied as stage number information J2 to the fine delay controlling circuit 22 and stage number detecting circuit 53. The stage number detecting circuit 53 compares the current delay stage number J1 with the value of the stage number J2 of the fine delay units corresponding to one rough delay unit, determines whether to carry out processing to advance or regress the rough variable delay circuits 11, 15, and supplies the overflow signal $\phi$OF or underflow signal $\phi$UF to the DLL controlling circuit 23.

The phase adjustment operation in fine phase comparison (S41 to S51 in FIG. 21) is explained for the following cases: shifting up the fine variable delay circuits (+1 in S42), shifting down the fine variable delay circuits (−1 in S42), and the fine phase comparator locking on (YES in S42).

During a shift up, the stage number detecting circuit 53 compares the delay stage number J1 used in the fine variable delay circuits with the stage number information J2 set by the stage number setting circuit 52, at the time of shift up processing for the fine variable delay circuit according to the fine phase comparison results (+1 in S42). When the delay stage number J1 used in the fine variable delay circuits 12, 16 is not as great as one stages of delay units for the rough variable delay circuits, processing to advance the rough variable delay circuits is determined to be unnecessary by the stage number detecting circuit 53 (NO in S43). At this time, the fine variable delay circuits 12, 16 are shifted up by one level by the fine delay control circuit 22 (S44). Also, the overflow signal φOF is not supplied from the stage number detecting circuit 53 to the DLL controlling circuit 23.

In the case where the delay stage number J1 used for the fine variable delay circuits is as great as one stages of delay units for the rough variable delay circuits, processing to advance the rough variable delay circuits is determined to be necessary by the stage number detecting circuit 53 (YES in S43). The overflow signal φOF is supplied from the stage number detecting circuit 53 to the DLL controlling circuit. At this time, as shown in FIG. 20, the up signal UP is supplied from the DLL controlling circuit 23 to the rough phase comparator 19. The rough phase comparator 19 generates the signals φSO, φSE for shifting up by one stage; and the rough delay controlling circuit 20 raises the delay amounts of the rough variable delay circuits 11, 15 by one stage (S45). The reset signal φmin is supplied from the rough phase comparator 19 to the fine delay controlling circuit 22 and the fine variable delay circuits 12, 16 are set to the minimum stage number (S46). This reset signal φmin is generated automatically when the rough delay controlling circuit performs the shift up operation for the delay amounts of the rough variable delay circuits. When the abovementioned shift up processing is finished, fine phase comparison is carried out again (S41).

Next, when the shift down processing of the fine variable delay circuit 22 happens according to the results of fine phase comparison (−1 in S42) upon shift down, the stage number detecting circuit 53 compares the delay stage number J1 used in the fine variable delay circuits 12, 16 with the stage number information J2 set by the stage number setting circuit 52. In the case where the delay stage number J1 used in the fine variable delay circuit 22 does not reach the minimum stage, processing to regress the rough variable delay circuits 11, 15 is determined to be unnecessary by the stage number detecting circuit 53 (NO in S48). The fine variable delay circuits 12, 16 are thereby shifted down by one stage according to the fine delay controlling circuit 22 (S41). At this time, the underflow signal φUF is not supplied from the stage number detecting circuit to the DLL controlling circuit.

In the case where the delay stage number J1 used in the fine variable delay circuits 12, 16 reaches the minimum stage, processing to regress the rough variable delay circuits 11, 15 is determined to be necessary by the stage number detecting circuit 53 (YES in S48). The underflow signal φUF is supplied from the stage number detecting circuit 53 to the DLL controlling circuit 23. At this time, as shown in FIG. 20, the down signal DOWN is supplied from the DLL controlling circuit 23 to the rough phase comparator 19 and the rough variable delay circuits 11, 15 are shifted down by one stage (S49). The set signal φmax is supplied from the rough phase comparator 19 to the fine delay controlling circuit 22 and the fine variable delay circuits 12, 16 is set to the maximum stage number (S50). The set signal φmax is generated automatically when the rough delay controlling circuit 20 performs the shift down operation for the rough variable delay circuits 11, 15. When the abovementioned shift down processing ends, fine phase comparison is performed once more (S41).

Here, the maximum stage number is the number of delay units of the fine variable delay circuits corresponding to one delay unit of the rough variable delay circuits. The maximum stage number is set based on the stage number information J2 from the stage number setting circuit 52. As discussed below, the stage number setting circuit 52 compares the phase of the clock passing through the rough delay unit with that of the clock passing through the fine variable delay circuits and sets the stage number of the fine variable delay circuits so that those phases match. Consequently, the maximum stage number is set repeatedly according to the operating environment. The set stage number is provided as the maximum stage number J2 to the fine delay controlling circuit 22 and the stage number detecting circuit 53.

As a result of fine phase adjustment, when the fine phase comparator 21 locks on (YES in S42), the fine lock on signal JST-F is output to the divider 14 and the division rate is set to a longer cycle (1/256 division) (S47) as in the first embodiment. The abovementioned shift up and shift down operations are performed in the case where the clock signals CLK, c-clk vary due to power source noise or the like and the fine phase comparator 21 shifts from the locked on state.

The internal clock signal i-clk becomes the timing clock CLK12 and is supplied to the data output buffer via the rough variable delay circuit 11 and fine variable delay circuit 12 with delay amounts set by phase adjustment as above. The data output buffer 13 synchronizes with the supplied timing clock CLK12 and takes up internal data DATA and outputs the data outside the device.

During fine phase adjustment in the present embodiment, processing to advance or regress the rough variable delay circuits is performed according to the stage number used for the fine variable delay circuit 22. For this reason, the fine phase adjustment operations can be continuous due to the processing to advance or regress the rough variable delay circuits and more correct phase adjustment becomes possible, even in cases where the fine variable delay circuits overflow or underflow. The delay amounts of the rough variable delay circuits are fixed so long as the fine variable delay circuits do not overflow or underflow. For this reason, even if the phase of the reference clock is temporarily shifted, the phase of the timing clock generated is adjusted in fine delay units at the most. There are therefore no great fluctuations in the phase of the timing clock and no major shifts from the locked on state.

Stage Number Setting Circuit

Figure 22:
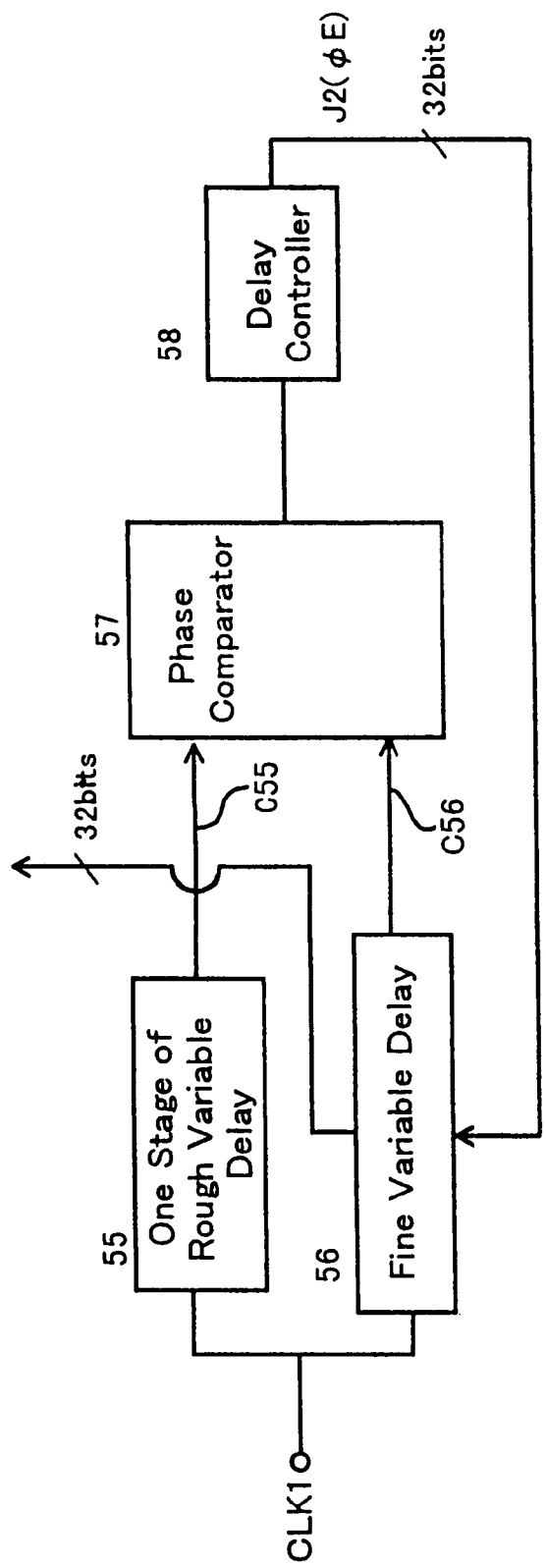
FIG. 22 shows the level setting circuit.

FIG. 22 shows the stage number setting circuit. As discussed above, it is necessary to adjust the maximum stage number of the fine variable delay circuits 12, 16 in rough delay units in the fourth embodiment. However, the stage number of fine delay units corresponding to a rough delay unit varies depending on power source voltage, temperature, and so forth. The stage number of fine delay units matching a rough delay unit is therefore detected appropriately by the stage number setting circuit 52.

The stage number setting circuit shown in FIG. 22 comprises a rough delay unit delaying circuit 55 and a fine variable delay circuit 56. The rough delay unit delaying circuit 55 comprises the inverter 108 and NAND gate 127, for example, shown in FIG. 8. Also, the fine variable delay circuit 56 is the same as the circuit shown in FIG. 9. The clock CLK1 is supplied to both delaying circuits 55 and the phases of each delayed clock C55, C56 are compared with the phase comparison circuit 57. The phase comparison circuit 57 is the same as the phase comparators shown in FIGS. 10 and 12. According to the comparison results, the delay controlling circuit 58 supplies a delay control signal J2 to the fine variable delay circuit 56 so that the phases of both clocks C55, C56 match. When the fine variable delay circuit

56 comprises 32 stages as in FIG. 9, the delay control signal J2 comprises 32 bits. In other words, the signal J2 corresponds to the delay control signals φE-1 to φE-32 in FIG. 9.

When this DLL circuit locks on, the delay control signal J2 in the locked on state shows the stage number of fine delay units corresponding to a rough delay unit at that time. Consequently, this delay control signal J2 is supplied to the fine delay controlling circuit 22 as maximum stage number information J2.

Fine Delay Controlling Circuit in the Fourth Embodiment

Figure 23:
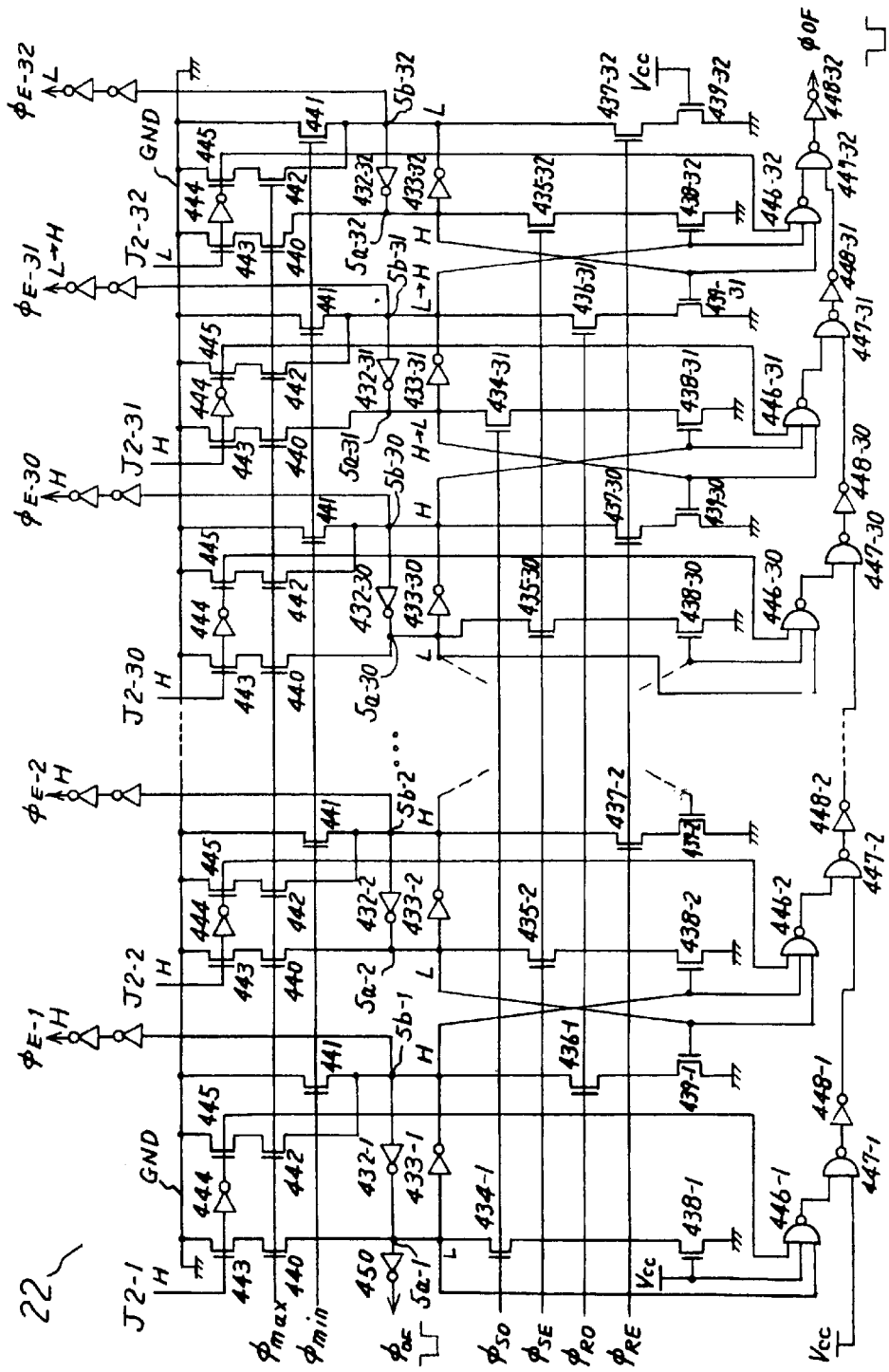
FIG. 23 shows the fine delay controlling circuit in the fourth embodiment.

FIG. 23 shows the fine delay controlling circuit used in the fourth embodiment. This fine delay controlling circuit 22 resembles the delay controlling circuit shown in FIG. 14 and comprises 32 stages from left to right. Consequently, the same call-outs are used for corresponding elements. The fine delay controlling circuit 22 in the fourth embodiment, as well as the delay controlling circuit in FIG. 14, is constituted to be able to set the maximum stage number according to the stage number signal J2 from the stage number setting circuit. Furthermore, the fine delay controlling circuit in FIG. 23 comprises a stage number detecting circuit 53 and has the function of generating the overflow signal φOF and the underflow signal φUF.

Elements differing from FIG. 14 include a transistor 440, conductive in response to the set signal φmax for setting the maximum stage number, and a transistor 441, conductive in response to a reset signal φmin for setting the minimum stage number. When those transistors are conductive, nodes 5a-n or 5b-n of each stage are connected to a ground terminal GND and set low. As a result, a latch circuit comprising inverters 432-n, 433-n is set either way.

When the transistor 440 becomes conductive in response to the set signal φmax for setting the maximum stage number, the node 5a-n becomes low and the delay control signals φE-n all become high. All the transistors TR in the fine variable delay circuits thereby become conductive, resulting in the maximum delay stage number.

The stage number setting signal J2 is supplied to the fine delay controlling circuit 22. In response to this 32 bit stage number setting signal J2, the transistor 443 is controlled and the transistor 445 is controlled by means of the inverter 444. The set signal φmax is supplied to the transistor 442 as well. Consequently, when the stage number setting signal J2 is in the high level, the transistor 443 conducts and the transistor 445 becomes non-conductive. Due to the set signal φmax being high, the node 5a-n is set low and the corresponding delay control signal φE-n is set high. Meanwhile, when the stage number setting signal J2 is in the low level, the transistor 443 becomes non-conductive and the transistor 445 becomes conductive. Due to the set signal φmax being high, the node 5b-n is set low and the corresponding delay control signal φE-n is set low. In other words, the stage number sitting signal J2 can be used to set the high stage number of the delay control signal φE-n, for setting the maximum stage number, which is generated in response to the set signal φmax.6.

For example, as shown in FIG. 23, the stage number setting signals J2-1 to J2-31 are set high and the signal J2-32 is set low. In other words, the number of fine delay units corresponding to a rough delay unit is 31. In this case, nodes 5a-1 to 5a-31, from stage 1 to stage 31, are set low and node 5b-32 in level 32 is set low in response to the set signal φmax for setting the maximum stage number being high. As a result, only the delay control signal φE-32 becomes low and all the other delay control signals φE-1 to φE-31 become high. As a result, the fine variable delay circuits 12, 16 are set to the maximum delay amount of stage 31.

Meanwhile, the reset signal φmin set to the minimum stage number sets all the nodes 5b-n low, like the reset signal φR in FIG. 14. As a result, the delay control signals φE-n are all set low and the fine variable delay circuits 12, 16 are set to the minimum delay amount of stage 0.

Next, the function of the stage number detecting circuit for generating the overflow signal φOF and underflow signal φUF is explained. The underflow signal φUF is generated via the inverter 450 in response to the first stage node 5a-1. When the delay control signals φE-n all become low and suppress the variable delay circuits to the minimum stage number, the first stage node 5a-1 becomes high and a low underflow signal φUF is generated in response thereto.

Meanwhile, the overflow signal φOF is generated by the NAND gates 446-n, 447-n and inverters 448-n of each stage. The node 5a-n of the corresponding stage, the node 5b-n of the previous stage, and the inverse signal of the stage number setting signal J2 are input to the NAND gate 446-n of each stage. Accordingly, in the stage where the stage number setting signal J2 is high, the output of the NAND gate 446-n remains high and the output of the inverter 448-1 becomes high. As a result of the increase to the stage number of the fine variable delay circuits, the level number setting signal J2 is in a low level, the corresponding node 5a-n becomes high, and the node 5b-n–1 of the previous stage becomes high, whereupon the output of the NAND gate 446-n becomes low. As a result, the output of the NAND gate 446-n becomes low, the output of the NAND gate 447-n becomes high, and the output of the inverter 448-n becomes low, wherein the outputs of all the inverters 448-n+1 to 31 in the upper levels become low. Consequently, the output of the inverter 448-32 in the final stage becomes low as well and a low overflow signal φOF is generated.

FIG. 23 shows an example wherein the stage number setting signals J2-1 to J2-31 are high and the signal J2-32 is low. In this case, when the phase result signal φSO is generated in the state where the node 5a-30 from the first to thirtieth level is low and the node 5b-30 is high, the transistor 434-31 conducts, as shown in the figure, setting the node 5a-31 low, changing the node 5b-31 to high, and increasing the stage number of the fine variable delay circuits by one. As a result, the inputs to the NAND gate 446-31 all become high and the output becomes low. Consequently, the output of the NAND gate 447-32 becomes high, the output of the inverter 448-32 becomes low, and a low overflow signal φOF is generated.

The overflow signal φOF is supplied to the DLL controlling circuit 23; in response thereto, the up signal UP is supplied to the rough phase comparator 19. Also, in response to the underflow signal φUF, the DLL controlling circuit 23 supplies the down signal DOWN to the phase comparator 19.

As shown in the circuitry for the phase comparator in FIG. 10, the latch circuit comprising the inverter 252 and the NAND gate 253 for latching the phase comparison results is inverted in response to the up signal UP. This results in forcing a change from the state (B) wherein the rough phase comparator 19 is locked on to the state (A) wherein the phase of the variable clock d-i-clk is ahead of the reference clock c-clk. In response to these phase comparison results, the rough phase comparator 19 outputs a phase comparison result signal φSO or φSE for increasing the delay amount of the rough variable delay circuits 11, 15. As a result, the rough delay controlling circuit 20 increases the delay amounts of the rough variable delay circuits 11, 15 by one stage.

Furthermore, the rough phase comparator 19 includes a NOR gate 250 for generating a reset signal φmin in response to the sampling signal φa when the signals φSO, φSE are output, as shown in FIG. 12. As shown in FIGS. 20 and 23, this reset signal φmin is supplied to the fine delay controlling circuit 22, wherein the fine variable delay circuits 12, 16 are reset to the minimum stage (stage 0).

Meanwhile, the down signal DOWN is supplied to the rough phase comparator 19 in response to the underflow signal φUF. In the rough phase comparator 19 as shown in FIG. 10, the latch circuit, for latching the phase comparison results and comprising an inverter 254 and NAND gate 255, is inverted in response to the down signal DOWN. This results in forcing a change from the state (B) wherein the rough phase comparator 19 is locked on to the state (C) wherein the phase of the variable clock d-i-clk is delayed by the reference clock c-clk. In response to these phase comparison results, the rough phase comparator 19 outputs a phase comparison result signal φRO or φRE for reducing the delay amounts of the rough variable delay circuits 11, 15. As a result, the rough delay controlling circuit 20 reduces the delay amounts of the rough variable delay circuits 11, 15 by one stage.

Furthermore, as shown in FIG. 12, the rough phase comparator 19 generates, via a NOR gate 251, a set signal φmax in response to the sampling signal φa when the signals φRO, φRE are output. This set signal φmax is supplied to the fine delay controlling circuit 22; the stage numbers of the fine variable delay circuits 12, 16 are set to the maximum stage number (stage J2).

As above, the fourth embodiment is constituted so as to detect the number of fine delay units corresponding to one rough delay unit, such that the overflow signal φOF is generated when the fine variable delay circuits 12, 16 are held to the number of delay units detected. Consequently, the maximum stage numbers of the fine variable delay circuits are optimized according to the power source and temperature during operation. As a result, the stage numbers of the rough variable delay circuits are increased or decreased appropriately and fine phase adjustment can be continued when only fine phase adjustment works after entering the locked on state in rough phase adjustment, and when the fine variable delay circuits overflow or underflow. Consequently, for a temporary phase shift between the external clock CLK and internal clock i-clk, phase adjustment can be carried out with the minimum delay units, while the phase of the timing clock can be kept from following the phase of the external clock CLK and internal clock i-clk.

The divider 14 was used in the abovementioned embodiment. The internal clock i-clk is used as the reference clock, but it is preferable to use the divided internal clock as the clock within the DLL circuit. This is because the speed of operations within the DLL circuit can be reduced to avoid erroneous operations and this can reduce power consumption. However, the internal clock i-clk can also be used directly within the DLL circuit without having passed through the divider 14.

Furthermore, in the abovementioned embodiment, a feedback clock CLK16 is generated by delaying the divided clock/CLK1 with the variable delay circuits 15, 16. However, the feedback clock CLK16 may also use the clock formed by separately dividing the timing clock CLK12. The variable delay circuits 15, 16 can thereby be omitted.

With the present invention, as explained above, rough phase adjustment is performed at the start of phase adjustment; when that locks on, phase comparison operations by the rough phase comparator are halted and fine phase adjustment is performed according to phase comparison operations by the fine phase comparator. Consequently, even with a temporary shift of the phase of the reference clock, the delay amount of the rough variable delay circuit is not varied and the delay amount is changed in fine delay units at the most. Fluctuation in the timing clock generated can therefore be reduced.

Furthermore, with the present invention, subsequent phase adjustment is halted once fine phase adjustment locks on, fluctuation of the timing clock can thereby be eliminated.

Furthermore, with the present invention, fine phase adjustment can be performed continuously by increasing or decreasing the delay amount of the rough variable delay circuit as appropriate when the fine variable delay circuit overflows or underflows during fine phase adjustment.

What is claimed is:

1. A timing clock generation circuit for regulating a phase of a reference clock and generating a timing clock comprising:

a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together;

a feedback clock, said feedback clock having a same phase as said timing clock output from said first variable delay circuit;

a variable clock, said variable clock generated by delaying said feedback clock with a dummy circuit for a predetermined time period;

a rough phase comparing/delay controlling circuit for comparing the phase of the reference clock with a phase of said variable clock and controlling said rough variable delay circuit so that the phases of the reference and variable clocks match;

a fine phase comparing/delay controlling circuit for comparing the phases of said variable clock and said reference clock and controlling said fine variable delay circuit so that the phases of the variable and reference clocks match; and a DLL controlling circuit for activating said rough phase comparing/delay controlling circuit at an initiation of phase adjustment, maintaining the delay time of said rough variable delay circuit after said rough phase comparing/delay controlling circuit detects lock on, and activating said fine phase comparing/delay controlling circuit, so as to cause said fine variable delay circuit to carry out delay control.

2. The timing clock generation circuit, according to claim 1, further comprising:

a divider for dividing said reference flock wherein a frequency of the reference clock subject to said phase comparison is divided by said divider; and wherein said divider reduces a division rate so as to further reduce the frequency of the reference clock subject to said phase comparison, after said fine phase comparing/delay controlling circuit detects lock on.

3. The timing clock generation circuit, according to claim 2 wherein:

after said DLL controlling circuit activates said fine phase comparing/delay controlling circuit, said divider reduces said division rate so as to further reduce the frequency of the reference clock subject to said phase comparison when the fine phase comparing/delay controlling circuit has carried out phase adjustment for a prescribed number of times.

4. The timing clock generation circuit, according to claim 3 wherein:

said prescribed number of times is a number approximately equal to a number of delay stages in said fine variable delay circuit.

5. The timing clock generation circuit, according to claim 1 wherein:

said phase adjustment is started when power is applied or upon recovery from power down mode.

6. A timing clock generation circuit for regulating the phase of a reference clock and generating a timing clock comprising:

a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together;

a feedback clock, said feedback clock having a same phase as said timing clock output from said first variable delay circuit;

a variable clock, said variable clock generated by delaying said feedback clock with a dummy circuit for a predetermined time period;

a rough phase comparing/delay controlling circuit for comparing the phase of the reference clock with a phase of said variable clock and controlling said rough variable delay circuit so that those phases match;

a fine phase comparing/delay controlling circuit for comparing the phases of said variable clock and said reference clock and controlling said fine variable delay circuit so that those phases match; and a DLL controlling circuit for activating said rough phase comparing/delay controlling circuit at the initiation of phase adjustment, stopping said rough phase comparing/delay controlling circuit after said rough phase comparing/delay controlling circuit detects lock on, and activating said fine phase comparing/delay controlling circuit, so as to cause said fine variable delay circuit to carry out delay control.

7. A timing clock generation circuit for regulating the phase of a reference clock and generating a timing clock comprising:

a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together;

a feedback clock, said feedback clock having a same phase as said timing clock output from said first variable delay circuit;

a variable clock, said variable clock generated by delaying said feedback clock with a dummy circuit for a predetermined time period;

a rough phase comparing/delay controlling circuit for comparing the phase of the reference clock with a the phase of said variable clock and controlling said rough variable delay circuit so that those phases match;

a fine phase comparing/delay controlling circuit for comparing the phases of said variable clock and said reference clock and controlling said fine variable delay circuit so that those phases match; and a DLL controlling circuit for activating said rough phase comparing/delay controlling circuit at the start of phase adjustment, maintaining the delay time of said rough variable delay circuit while activating said fine phase comparing/delay controlling circuit after said rough phase comparing/delay controlling circuit detects lock on, and maintaining the delay time of the fine variable delay circuit so as to end phase adjustment when said fine phase comparing/delay controlling circuit detects lock on.

8. The timing clock generation circuit, according to claim 7 further comprising:

a divider for dividing said reference clock, wherein a frequency of the reference clock subject to said phase comparison is divided with said divider.

9. The timing clock generation circuit, according to claim 7 wherein:

said phase adjustment is started when power is applied or upon recovery from power down mode.

10. The timing clock generation circuit, according to claim 7 wherein:

after activating said fine phase comparing/delay controlling circuit, said DLL controlling circuit maintains the delay time of said fine variable delay circuit and ends said phase adjustment once the fine phase comparing/delay controlling circuit has carried out phase adjustment for a prescribed number of times.

11. The timing clock generation circuit, according to claim 10 wherein:

said prescribed number of times is a number approximately equal to the number of delay levels in said fine variable delay circuit.

12. A timing clock generation circuit for regulating the phase of a reference clock and generating a timing clock comprising:

a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and fine variable delay circuits are serially connected together;

a feedback clock, said feedback clock having a same phase as said timing clock output from said first variable delay circuit;

a variable clock, said variable clock generated by delaying said feedback clock with a dummy circuit for a predetermined time period;

a rough phase comparing/delay controlling circuit for comparing the phase of the reference clock with a phase of said variable clock and controlling said rough variable delay circuit so that those phases match;

a fine phase comparing/delay controlling circuit for comparing the phases of said variable clock and said reference clock and controlling said fine variable delay circuit so that those phases match; and a DLL controlling circuit for activating said rough phase comparing/delay controlling circuit at the start of phase adjustment, halting phase comparison by said rough phase comparing/delay controlling circuit and activating said fine phase comparing/delay controlling circuit after said rough phase comparing/delay controlling circuit detects lock on, and ending phase comparison by said fine phase comparing/delay controlling circuit when said fine phase comparing/delay controlling circuit detects lock on.

13. A timing clock generation circuit for regulating the phase of a reference clock and generating a timing clock comprising:

a first variable delay circuit which delays said reference clock for a delay time and outputs said timing clock, and which comprises a rough variable delay circuit including rough delay units and a fine variable delay circuit including fine delay units each having an unit delay time which is shorter than each of said rough delay units, wherein the rough and find variable delay circuits are serially connected together;

a feedback clock, said feedback clock having a same phase as said timing clock output from said first variable delay circuit;

a variable clock, said variable clock generated by delaying said feedback clock with a dummy circuit for a predetermined time period;

a rough phase comparing/delay controlling circuit for comparing the phase of the reference clock with a phase of said variable clock and controlling said rough variable delay circuit so that those phases match; and a fine phase comparing/delay controlling circuit for comparing the phases of said variable clock and said reference clock and controlling said fine variable delay circuit so that those phases match;

wherein said rough phase comparing/delay controlling circuit is activated and the delay amount of said rough variable delay circuit is controlled when phase adjustment begins;

wherein after said rough phase comparing/delay controlling circuit detects a lock on, phase comparison by said rough phase comparing/delay controlling circuit ends and said time phase comparing/delay controlling circuit is activated so that the delay amount of said fine variable delay circuit is controlled; and in the case where said fine variable delay circuit exceeds a maximum delay amount, the delay amount of said rough variable delay circuit is increased by said rough delay unit; and in the case where said fine variable delay circuit is less than a minimum delay amount, the delay amount of said rough variable delay circuit is decreased by said rough delay unit.

14. The timing clock generation circuit, according to claim 12 wherein:

in the case where said fine variable delay circuit exceeds said maximum delay amount, the delay amount of said rough variable delay circuit is increased by said rough delay unit, while said fine variable delay circuit is set to said minimum delay amount; and in the case where said fine variable delay circuit is less than said minimum delay amount, the delay amount of said rough variable delay circuit is reduced by said rough delay unit, while said fine variable delay circuit is set to said maximum delay amount.

15. The timing clock generation circuit, according to claim 13 or 14 wherein:

said maximum delay amount of said fine variable delay circuit is set to a delay amount corresponding to said rough delay unit.

16. The timing clock generation circuit, according to claim 13 or 14 further comprising:

a divider for dividing said reference clock wherein the frequency of the reference clock subject to said phase comparison is divided by said divider; and wherein said divider decreases its division rate so as to further reduce the frequency of the reference clock subject to said phase comparison after said fine phase comparing/delay controlling circuit detects lock on.

17. The timing clock generation circuit, according to claim 13 or 14 wherein:

said phase adjustment begins when power is applied or upon recovery from the power down mode.

18. The timing clock generation circuit, according to claim 13 or 14, further comprising:

a delay stage number setting circuit including: a first delay circuit with the delay amount in rough delay units; a second delay circuit controlling the delay in fine delay units; and a phase comparing/delay controlling circuit for comparing the phases of the clock delayed by the first and second delay circuits and controlling the number of delay units for said second delay circuit so that those phases match;

wherein the maximum stage number of said fine delay controlling circuit is set according to a set delay terminal number of said delay stage number setting circuit.

* * * * *